(12) United States Patent
Kumon et al.

(10) Patent No.: US 9,691,603 B2
(45) Date of Patent: Jun. 27, 2017

(54) CHEMICAL FOR FORMING PROTECTIVE FILM

(75) Inventors: Soichi Kumon, Matsusaka (JP);
Takashi Saio, Suzuka (JP); Shinobu Arata, Matsusaka (JP); Masanori Saito, Matsusaka (JP); Atsushi Ryokawa, Ube (JP); Shuhei Yamada, Ube (JP); Hidehisa Nanai, Tokyo (JP); Yoshinori Akamatsu, Matsusaka (JP)

(73) Assignee: Central Glass Company, Limited, Ube-shi (JP)

( * ) Notice: Subject to any disclaimer, the term of this patent is extended or adjusted under 35 U.S.C. 154(b) by 628 days.

(21) Appl. No.: 13/698,244

(22) PCT Filed: May 11, 2011

(86) PCT No.: PCT/JP2011/060856
§ 371 (c)(1),
(2), (4) Date: Nov. 15, 2012

(87) PCT Pub. No.: WO2011/145500
PCT Pub. Date: Nov. 24, 2011

(65) Prior Publication Data
US 2013/0056023 A1 Mar. 7, 2013

(30) Foreign Application Priority Data

May 19, 2010 (JP) .................................. 2010-115396
Jun. 29, 2010 (JP) .................................. 2010-148222
Apr. 18, 2011 (JP) .................................. 2011-091952

(51) Int. Cl.
*H01L 21/302* (2006.01)
*H01L 21/02* (2006.01)
(Continued)

(52) U.S. Cl.
CPC ...... *H01L 21/02057* (2013.01); *C09D 183/08* (2013.01); *H01L 21/0206* (2013.01); *H01L 21/302* (2013.01); *H01L 21/3105* (2013.01)

(58) Field of Classification Search
CPC ......... H01L 21/02126; H01L 21/02203; H01L 21/02282
See application file for complete search history.

(56) References Cited

U.S. PATENT DOCUMENTS

2006/0188657 A1* 8/2006 Kimura et al. ............ 427/407.2
2006/0249818 A1* 11/2006 Peterson et al. ............... 257/632
(Continued)

FOREIGN PATENT DOCUMENTS

JP 5-299336 A 11/1993
JP 2005-244203 A 9/2005
(Continued)

OTHER PUBLICATIONS

International Search Report with English translation dated Aug. 16, 2011 (eight (8) pages).
(Continued)

*Primary Examiner* — Gregory Webb
(74) *Attorney, Agent, or Firm* — Crowell & Moring LLP

(57) ABSTRACT

Disclosed is a liquid chemical for forming a water repellent protective film on a wafer that has at its surface a finely uneven pattern and contains silicon element at least at a part of the uneven pattern, the water repellent protective film being formed at least on surfaces of recessed portions of the uneven pattern at the time of cleaning the wafer. The liquid chemical contains: a silicon compound (A) represented by the general formula $R^1{}_a Si(H)_b(X)_{4-a-b}$ and an acid; or a silicon compound (C) represented by the general formula $R^7{}_g Si(H)_h(CH_3)_w(Z)_{4-g-h-w}$ and a base that contains no more than 35 mass % of water. The total amount of water in
(Continued)

the liquid chemical is no greater than 1000 mass ppm relative to the total amount of the liquid chemical. The liquid chemical can improve a cleaning step that easily induces pattern collapse.

8 Claims, 2 Drawing Sheets

(51) Int. Cl.
    *H01L 21/3105*     (2006.01)
    *C09D 183/08*     (2006.01)

(56) References Cited

U.S. PATENT DOCUMENTS

| | | | |
|---|---|---|---|
| 2008/0213494 A1* | 9/2008 | Kimura et al. | 427/430.1 |
| 2008/0241489 A1 | 10/2008 | Ishibashi et al. | |
| 2008/0246036 A1 | 10/2008 | Yamazaki et al. | |
| 2008/0290521 A1* | 11/2008 | Hamada et al. | 257/759 |
| 2009/0281238 A1* | 11/2009 | Hidaka et al. | 524/588 |
| 2009/0311874 A1 | 12/2009 | Tomita et al. | |
| 2010/0075504 A1 | 3/2010 | Tomita et al. | |
| 2010/0221443 A1* | 9/2010 | Kimura et al. | 427/419.8 |

FOREIGN PATENT DOCUMENTS

| | | |
|---|---|---|
| JP | 2008-198958 A | 8/2008 |
| JP | 2008-277748 A | 11/2008 |
| JP | 4403202 B1 | 1/2010 |
| JP | 2010-114414 A | 5/2010 |

OTHER PUBLICATIONS

Japanese Written Opinion (PCT/ISA/237) (four (4) pages).
Japanese Industrial Standard (JIS) JIS R 3257 (sixteen (16) pages).
Japanese industrial Standard Handbook (JIS) JIS B 0601, "Machine Elements", 2003 (sixteen (16) pages).

* cited by examiner

CHEMICAL FOR FORMING PROTECTIVE FILM

TECHNICAL FIELD

The present invention relates to a technique of cleaning a substrate (a wafer) in semiconductor device fabrication or the like which technique aims to improve the production yield of devices having a circuit pattern which is particularly fine and particularly high in aspect ratio. More specifically, the present invention relates to a liquid chemical for forming a water repellent protective film and the like which aims to improve a cleaning step that easily induces pattern collapse on a wafer having a finely uneven pattern at its surface.

BACKGROUND OF THE INVENTION

Semiconductor devices for use in networks or digital household electric appliances are being further desired to be sophisticated, multifunctional, and low in power consumption. Accordingly, the trend toward micro-patterning for circuits has been developed, with which micro-sizing of particles has advanced to cause reduction of the production yield. As a result of this, a cleaning step which aims to remove contaminants such as the micro-sized particles and the like is frequently used. As a result, 30-40% of the whole of the semiconductor fabrication process is occupied with the cleaning step.

On the other hand, in cleaning conventionally performed by using a mixed ammonia cleaning agent, damages to the wafer due to its basicity are getting serious with the trend toward micro-patterning for circuits. Therefore, alternation with a dilute hydrofluoric acid-based cleaning agent is taking place.

With this, problems about the damages to the wafer due to cleaning have been solved; however, problems due to an aspect ratio increased with the trend toward micro-processing in the semiconductor devices have become obvious. In other words, a phenomenon where the pattern is collapsed when a gas-liquid interface passes through the pattern is brought about after cleaning or rinsing so as to largely reduce the yield, which has become a significant problem.

The pattern collapse occurs at the time of drawing the wafer out of a cleaning liquid or a rinsing liquid. It is said that the reason thereof is that a difference in height of residual liquid between a part of high aspect ratio and a part of low aspect ratio causes a difference in capillary force which acts on the pattern.

Accordingly, it is expected, by decreasing the capillary force, that the difference in capillary force due to the difference in height of residual liquid is reduced thereby resolving the pattern collapse. The magnitude of the capillary force is the absolute value of P obtained by the equation as represented below. It is expected from this equation that the capillary force can be reduced by decreasing $\gamma$ or $\cos \theta$.

$$P=2\times\gamma\times\cos\theta/S$$

($\gamma$: Surface tension, $\theta$: Contact angle, S: Pattern width).

In Patent Publication 1, a technique of replacing water serving as a cleaning agent with 2-propanol before the gas-liquid interface passes through the pattern is disclosed as a method of decreasing $\gamma$ to suppress the pattern collapse. This method is effective for preventing the pattern collapse; however, a solvent having small $\gamma$ such as 2-propanol and the like is also small in normal contact angle, which results in the trend to increase $\cos \theta$. It is therefore said that there are limitations to adaptable patterns, for example, an aspect ratio of not higher than 5.

Additionally, in Patent Publication 2, a technique directed to a resist pattern is disclosed as a method for decreasing $\cos \theta$ in order to suppress the pattern collapse. This method is a method of setting a contact angle to around 90° to bring $\cos \theta$ close to 0 so as to reduce the capillary force to the limit thereby suppressing the pattern collapse. However, the disclosed technique cannot be applied to the present object because: the technique is one directed to the resist pattern or one for reforming a resist itself; and a final removal together with the resist is possible so as not to need the assumption about a method of removing a treatment agent after drying.

Additionally, in Patent Publication 3, there is disclosed a cleaning method including: surface-reforming an unevenly patterned wafer surface with a silicon-containing film; forming a water-repellent protective film on the surface by using a water-soluble surfactant or a silane coupling agent; reducing the capillary force; and thereby preventing the pattern collapse. However, the water repellent used as above is sometimes not sufficient for a water repellency-providing effect.

Additionally, the use of a critical fluid, the use of liquid nitrogen or the like are proposed as the method of preventing the pattern collapse of the semiconductor devices. However, any of these is difficult to apply to a mass-producing process because of its poorer throughput than in conventional cleaning steps, though effective to some extent.

REFERENCES ABOUT PRIOR ART

Patent Publication

Patent Publication 1: Japanese Patent Application Publication No. 2008-198958

Patent Publication 2: Japanese Patent Application Publication No. 5-299336

Patent Publication 3: Japanese Patent No. 4403202

SUMMARY OF THE INVENTION

In production of semiconductor devices, a wafer surface is formed into a surface having a finely uneven pattern. An object of the present invention is to provide a liquid chemical for forming a protective film, the liquid chemical being able to form a water repellent protective film on the unevenly patterned wafer surface while improving a cleaning step (that tends to induce a pattern collapse) in a process of producing a wafer that has at its surface a finely uneven pattern and contains silicon element at least at a part of the uneven pattern (the wafer may hereinafter be referred to as "a silicon wafer" or merely as "a wafer"), without lowering throughput.

The liquid chemical for forming a protective film, the liquid chemical being able to form a water repellent protective film on a wafer that has at its surface an uneven pattern according to the present invention (the liquid chemical may hereinafter be referred to as "a liquid chemical for forming a protective film" or merely as "a liquid chemical") is a liquid chemical for forming a water repellent protective film (hereinafter referred to as "a water repellent protective film" or merely as "a protective film") on a wafer that has at its surface a finely uneven pattern and contains silicon element at least at a part of the uneven pattern, the water repellent protective film being formed at least on surfaces of recessed portions of the uneven pattern at the time of cleaning the wafer. The liquid chemical is characterized by containing: a silicon compound (A) represented by the following general formula [1]: and an acid that donates a proton to the silicon compound (A) and/or an acid that accepts electrons from the silicon compound (A), wherein the total amount of water in the liquid chemical is no greater than 1000 mass ppm relative to the total amount of the liquid chemical.

$$R^1_a Si(H)_b (X)_{4-a-b} \quad [1]$$

(In the formula [1], $R^1$ mutually independently represents at least one group selected from monovalent organic groups having a $C_1$-$C_{18}$ hydrocarbon group and monovalent organic groups having a $C_1$-$C_8$ fluoroalkyl chain. X mutually independently represents at least one group selected from halogen groups, monovalent organic groups of which element to be bonded to a silicon element is oxygen or nitrogen, and nitrile group. "a" is an integer of from 1 to 3, "b" is an integer of from 0 to 2, and the total of "a" and "b" is not larger than 3.)

$R^1$ shown in the above-mentioned general formula [1] reduces a surface energy of an article surface thereby reducing the interaction between water or another liquid and the surface of the article (i.e., at the interface), such as hydrogen bond, intermolecular forces and the like. The effect of reducing the interaction against water is particularly outstanding, but there is also exhibited an effect of reducing the interaction against a mixed liquid of water and a liquid other than water or against a liquid other than water. With this, the contact angle of the liquid to an article surface can be increased.

The protective film is formed by chemical bond between X of the general formula [1] and a silicon element of the silicon wafer. Since the protective film is formed on the surfaces of the recessed portions, the capillary force of the surfaces of the recessed portions is to decrease when a cleaning liquid is removed from the recessed portions of the silicon wafer or when the silicon wafer is dried. With this, the pattern collapse becomes difficult to occur. Additionally, it is possible to remove the protective film at subsequent steps.

The acid donates a proton to the silicon compound (A) or accepts electrons from the silicon compound (A) thereby acting as a catalyst that accelerates the reaction between the silicon compound (A) and the silicon element of the silicon wafer. The acid is considered to act through a mechanism as represented by the following formulas. The acid is indicated in the formulas by "L". The presence of the acid in the liquid chemical makes it possible to form the protective film in a short time. Incidentally, the acid may form a part of the protective film.

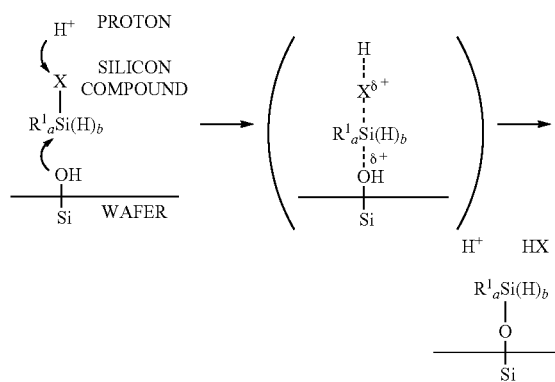

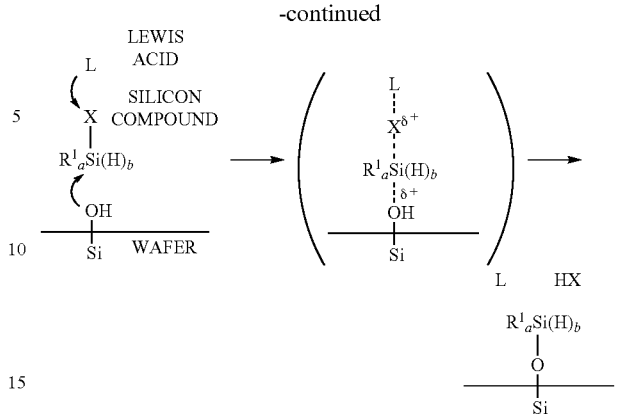

If the abundance of water is increased relative to that of the acid, the acid develops a tendency to donate a proton to water or accept electrons from water; therefore the action as a catalyst is weakened and additionally the formation of the protective film is made difficult. Accordingly, it is preferable that the total amount of water in the liquid chemical is not higher than 5000 mass ppm relative to the total amount of the liquid chemical. In a case where the water content exceeds 5000 mass ppm, the protective film becomes difficult to be formed in a short time. Hence a smaller total amount of water is more preferable. In particular, it is preferably not higher than 1000 mass ppm and more preferably not higher than 500 mass ppm. Furthermore, since a large abundance of water tends to reduce the storage ability of the liquid chemical, a smaller water content is more preferable; therefore the water content is preferably not higher than 200 mass ppm, more preferably not higher than 100 mass ppm. Incidentally, the total amount of water may be 0.1 mass ppm or more. Additionally, an acid having a smaller water content at the time of the starting material is preferable. The water content at the time of starting material is preferably not greater than 35 mass %, particularly preferably not greater than 10 mass %, further preferably not greater than 5 mass %, much more preferably not greater than 1 mass %. In addition, the water content of the acid may be not less than 0.001 mass %.

Furthermore, it is preferable that the silicon compound (A) represented by the general formula [1] is alkoxysilane represented by the following general formula [2].

$$R^2_c Si(H)_d (OR^3)_{4-c-d} \quad [2]$$

(In the formula [2], $R^2$ mutually independently represents at least one group selected from monovalent organic groups having a $C_1$-$C_{18}$ hydrocarbon group and monovalent organic groups having a $C_1$-$C_8$ fluoroalkyl chain. $R^3$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^3$ may have one or more of carbonyl group, ether bond, ester bond and hydroxyl group. "c" is an integer of from 1 to 3, "d" is an integer of from 0 to 2, and the total of "c" and "d" is not larger than 3.)

Additionally, the alkoxysilane and the acid contained in the liquid chemical may be obtained by reaction. For instance, those obtained through a reaction between a silicon compound (B) and alcohol as shown in the following formula [3] are acceptable.

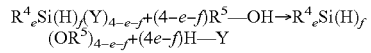

$$R^4_e Si(H)_f (Y)_{4-e-f} + (4-e-f)R^5\text{—OH} \rightarrow R^4_e Si(H)_f (OR^5)_{4-e-f} + (4e-f)H\text{—Y} \quad [3]$$

(In the formula [3], $R^4_e Si(H)_f(Y)_{4-e-f}$ represents a silicon compound (B) and $R^5$—OH represents alcohol. $R^4_e Si(H)_f(OR^5)_{4-e-f}$ represents alkoxysilane obtained by the reaction, and H—Y represents acid. $R^4$ mutually independently represents at least one group selected from monovalent organic groups having a $C_1$-$C_{18}$ hydrocarbon group and monovalent organic groups having a $C_1$-$C_8$ fluoroalkyl chain. $R^5$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^5$ may have one or more of carbonyl group, ether bond, ester bond and hydroxyl group. "e" is an integer of from 1 to 3, "f" is an integer of from 0 to 2, and the total of "e" and "f" is not larger than 3. Additionally, Y mutually independently represents at least one group selected from halogen groups, —OS(O$_2$)—R$^6$ and —OC(O)—R$^6$ (R$^6$ is a $C_1$-$C_8$ hydrocarbon group the hydrogen elements of which may partially or entirely be replaced with a fluorine element(s).)

Furthermore, the liquid chemical for forming a protective film, according to the present invention may be one that contains a silicon compound (C) represented by the following general formula [4] and a base that contains no more than 35 mass % of water, wherein the total amount of water in the liquid chemical is no greater than 1000 mass ppm relative to the total amount of the liquid chemical.

$$R^7_g Si(H)_h(CH_3)_w(Z)_{4-g-h-w} \quad [4]$$

(In the formula [4], $R^7$ mutually independently represents at least one group selected from monovalent organic groups having a $C_2$-$C_{18}$ hydrocarbon group and monovalent organic groups having a $C_2$-$C_8$ fluoroalkyl chain. Z mutually independently represents at least one group selected from halogen groups and monovalent organic groups of which element to be bonded to a silicon element is oxygen. "g" is an integer of from 0 to 3, "h" is an integer of from 0 to 2, and "w" is an integer of from 0 to 2. The total of "g" and "h" is 1 to 3, the total of "g" and "w" is 1 to 3, and the total of "g", "h" and "w" is 1 to 3.)

$R^7$ and CH$_3$ shown in the above-mentioned general formula [4] reduces a surface energy of an article surface thereby reducing the interaction between water or another liquid and the surface of the article (i.e., at the interface), such as hydrogen bond, intermolecular forces and the like. The effect of reducing the interaction against water is particularly outstanding, but an effect of reducing the interaction against a mixed liquid of water and a liquid other than water or against a liquid other than water is also exhibited. With this, the contact angle of the liquid to an article surface can be increased.

The protective film is formed by chemical bond between Z of the general formula [4] and a silicon element of the silicon wafer. Since the protective film is formed on the surfaces of the recessed portions, the capillary force of the surfaces of the recessed portions is to decrease when a cleaning liquid is removed from the recessed portions of the silicon wafer or when the silicon wafer is dried. With this, the pattern collapse becomes difficult to occur. Additionally, it is possible to remove the protective film at subsequent steps.

The base is to act as a catalyst that accelerates the reaction between the silicon compound (C) and the silicon element of the silicon wafer. The presence of the base in the liquid chemical makes it possible to form the protective film in a short time. Incidentally, the base may form a part of the protective film.

The base, if it contains water, results in an increase of water content of the liquid chemical, which makes the protective film difficult to be formed. Hence it is more preferable that the base has a smaller water content. The water content is preferably no greater than 35 mass %, particularly preferably no greater than 10 mass %, further preferably no greater than 5 mass %, much more preferably no greater than 1 mass %. Additionally, the water content of the base may be 0.001 mass % or more.

Furthermore, it is preferable that the silicon compound (C) represented by the general formula [4] is alkoxysilane represented by the following general formula [5].

$$R^8_i Si(H)_j(CH_3)_k(OR^9)_{4-i-j-k} \quad [5]$$

(In the formula [5], $R^8$ mutually independently represents at least one group selected from monovalent organic groups having a $C_2$-$C_{18}$ hydrocarbon group and monovalent organic groups having a $C_2$-$C_8$ fluoroalkyl chain. $R^9$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^9$ may have one or more of carbonyl group, ether bond, ester bond and hydroxyl group. "i" is an integer of from 0 to 3, "j" is an integer of from 0 to 2, and "k" is an integer of from 0 to 2. The total of "i" and "j" is 1 to 3, the total of "i" and "k" is 1 to 3, and the total of "i", "j" and "k" is 1 to 3.)

Additionally, the alkoxysilane and the base contained in the liquid chemical may be obtained by reaction. For instance, those obtained through a reaction between a silicon compound (D) and alcohol as shown in the following formulas [6] and [7] are acceptable.

$$R^{10}_p Si(H)_q(CH_3)_r(W)_{4-p-q-r} + (4-p-q-r)R^{11}\text{—}OH \rightarrow R^{10}_p Si(H)_q(CH_3)_r(OR^{11})_{4-p-q-r} + (4-p-q-r)H\text{—}W \quad [6]$$

$$[R^{12}_s(CH_3)_t(H)_u Si]_v N\text{—}R^{13}_{3-v} + vR^{14}\text{—}OH \rightarrow vR^{12}_s(CH_3)_t(H)_u SiOR^{14} + N(H)_v(R^{13})_{3-v} \quad [7]$$

(In the formula [6], $R^{10}_p Si(H)_q(CH_3)_r(W)_{4-p-q-r}$ represents a silicon compound (D) and $R^{11}$—OH represents alcohol. $R^{10}_p Si(H)_q(CH_3)_r(OR^{11})_{4-p-q-r}$ represents alkoxysilane obtained by the reaction, and H—W represents base. Additionally, in the formula [7], $[R^{12}_s(CH_3)_t(H)_u Si]_v N\text{—}R^{13}_{3-v}$ represents a silicon compound (D) and $R^{14}$—OH represents alcohol. $R^{12}_s(CH_3)_t(H)_u SiOR^{14}$ represents alkoxysilane obtained by the reaction, and $N(H)_v(R^{13})_{3-v}$ represents base. $R^{10}$ mutually independently represents at least one group selected from monovalent organic groups having a $C_2$-$C_{18}$ hydrocarbon group and monovalent organic groups having a $C_2$-$C_8$ fluoroalkyl chain. $R^{11}$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^{11}$ may have one or more of carbonyl group, ether bond, ester bond and hydroxyl group. $R^{12}$ mutually independently represents at least one group selected from monovalent organic groups having a $C_2$-$C_{18}$ hydrocarbon group and monovalent organic groups having a $C_2$-$C_8$ fluoroalkyl chain. $R^{13}$ mutually independently represents at least one group selected from $C_1$-$C_8$ monovalent organic groups and hydrogen group. $R^{14}$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^{14}$ may have one or more of carbonyl group, ether bond, ester bond and hydroxyl group. "p" is an integer of from 0 to 3, "q" is an integer of from 0 to 2, and "r" is an integer of from 0 to 2. The total of "p" and "q" is 1 to 3, the total of "p" and "r" is 1 to 3, and the total of "p", "q" and "r" is 1 to 3. "s" is an integer of from 0 to 3, "t" is an integer of from 0 to 2, and "u" is an integer of from 0 to 2. The total of "s", "t" and "u" is 3. "v" is an integer of from 1 to 3. Furthermore, W mutually independently represents at least one group selected from amino group, dialkylamino group and isocyanate group.)

Additionally, concerning a particle measurement in a liquid phase of the liquid chemical, conducted by using a light scattering type liquid-borne particle detector, it is preferable that the number of particles of larger than 0.5 μm is not more than 100 per 1 mL of the liquid chemical. If the number of particles of larger than 0.5 μm exceeds 100 per 1 mL of the liquid chemical, there arises a fear of inducing a pattern damage due to particles. This may result in reducing the device in yield and reliability and therefore not preferable. Additionally, if the number of particles of larger than 0.5 μm is not more than 100 per 1 mL of the liquid chemical, a cleaning operation to be conducted with a solvent or water after the formation of the protective film can be omitted or shortened, and therefore preferable. Incidentally, the number of particles of larger than 0.5 μm may be more than 1 per 1 mL of the liquid chemical. Additionally, the particle measurement in the liquid phase of the liquid chemical according to the present invention is conducted by using a commercially available measurement device to which a laser light scattering type liquid-borne particle measuring method is applied, in which a particle diameter means a light scattering equivalent diameter based on a PSL (a latex formed of polystyrene) standard particle.

Additionally, it is preferable that the content of each of metal impurities, i.e., the content of each of Na, Mg, K, Ca, Mn, Fe and Cu in the liquid chemical is not more than 100 mass ppb relative to the total amount of the liquid chemical. All that exist in the liquid chemical in the form of metallic fine particles, ions, colloids, a complex, oxide or nitride, irrespective of whether dissolved or undissolved, are regarded as the metal impurity of the above-mentioned elements. The content of the metal impurity of exceeding 100 mass ppb relative to the total amount of the liquid chemical brings about a fear of increasing a junction leakage current in the device thereby resulting in reducing the device in yield and reliability, which is not preferable. Meanwhile, the content of the metal impurity of not larger than 100 mass ppb relative to the total amount of the liquid chemical is preferable because the cleaning operation to be conducted with use of a solvent or water after the formation of the protective film can be omitted or shortened. Incidentally, the content of each of the metal impurities may be 0.01 mass ppb or more relative to the total amount of the liquid chemical.

The liquid chemical for forming a protective film, according to the present invention is used in such a manner as to substitute a cleaning liquid with the liquid chemical in a step of cleaning the wafer formed having an uneven pattern. Additionally, the substituted liquid chemical may be further substituted with another cleaning liquid.

As discussed above, a cleaning liquid is substituted with the liquid chemical for forming a protective film and then the liquid chemical is retained at least on the surfaces of the recessed portions of the uneven pattern; in the mean time, the protective film is formed at least on the surfaces of the recessed portions of the uneven pattern. It is not necessary for the protective film of the present invention to be formed continuously and evenly; however, it is preferable to form it continuously and evenly in order to impart a more excellent water repellency thereto.

In the present invention, a water-repellent protective film for wafers means a film formed on a wafer surface so as to reduce the wettability of the wafer surface or to impart a water-repellency to the same. In the present invention, water repellency means a reduction of a surface energy of an article surface thereby weakening the interaction between water or another liquid and the surface of the article surface (i.e., at the interface), such as hydrogen bond, intermolecular forces and the like. The effect of reducing the interaction against water is particularly outstanding, but an effect of reducing the interaction against a mixed liquid of water and a liquid other than water or against a liquid other than water is also exhibited. With such a reduction of the interaction, the contact angle of the liquid to the article surface can be increased.

In the present invention, since the protective film is formed at least on the surfaces of the recessed portions of the uneven pattern, the capillary force of the surfaces of the recessed portions is to decrease when a cleaning liquid is removed from the recessed portions of the silicon wafer or when the silicon wafer is dried. With this, the pattern collapse becomes difficult to occur. Additionally, the protective film may be removed by at least one treatment selected from: irradiating the wafer surface with light; heating the wafer; exposing the wafer to ozone; and irradiating the wafer surface with plasma.

EFFECTS OF THE INVENTION

A protective film formed by a liquid chemical for forming a protective film, according to the present invention is excellent in water repellency, and therefore reduces the capillary force of an unevenly patterned surface of a wafer, and by extension brings about a pattern collapse-preventing effect. With the use of the liquid chemical, a cleaning step conducted in a process for producing the wafer formed having a finely unevenly patterned surface is improved without lowering throughput. Accordingly, the process for producing the wafer formed having the finely unevenly patterned surface, the process being conducted by using the liquid chemical for forming a protective film of the present invention, is excellent in productivity.

The liquid chemical for forming a protective film, according to the present invention is adaptable to uneven patterns having aspect ratios expected to rise more and more, for example, to an aspect ratio of not less than 7, and therefore allows cost reduction in producing more sophisticated semiconductor devices. In addition to this, the liquid chemical is adaptable without considerably modifying conventional apparatuses, so as to be able to become one applicable in production of various kinds of semiconductor devices.

DETAILED DESCRIPTION

Figure 1:
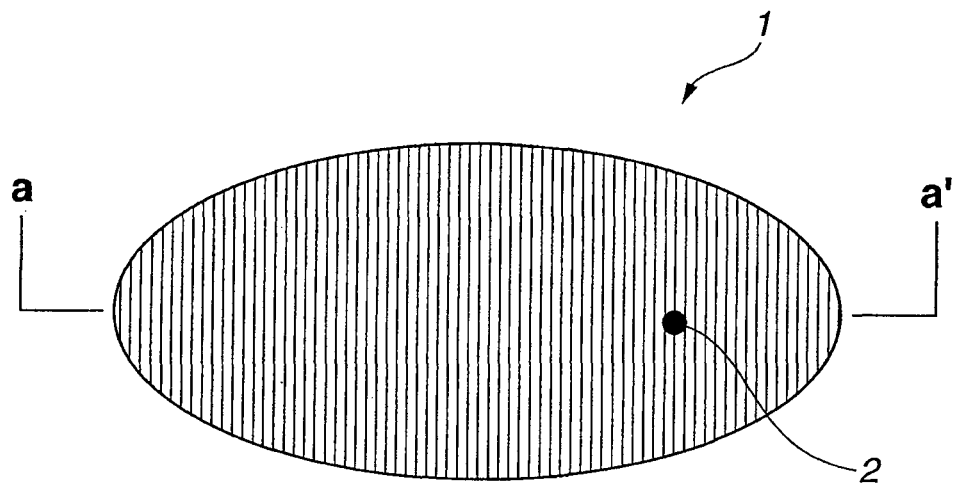
FIG. 1 A schematic plan view of a wafer 1 whose surface is made into a surface having a finely uneven pattern 2.

A preferable process for cleaning a wafer having at its surface a finely uneven pattern and containing silicon element at least at a part of the uneven pattern, in the use of a liquid chemical for forming a protective film according to the present invention, includes:

(a step 1) a step of making a surface of a wafer into a surface having a finely uneven pattern, followed by providing a water-based cleaning liquid to the surface and then retaining the water-based cleaning liquid at least on surfaces of recessed portions of the uneven pattern;

(a step 2) a step of substituting the water-based cleaning liquid retained at least on the surfaces of the recessed portions of the uneven pattern, with a cleaning liquid (A) different from the water-based cleaning liquid;

(a step 3) a step of substituting the cleaning liquid (A) with a liquid chemical for forming a protective film and then retaining the liquid chemical at least on the surfaces of the recessed portions of the uneven pattern;

(a step 4) a step of drying the surface of an unevenly patterned surface to remove the liquid therefrom; and (a step 5) a step of removing a protective film.

Furthermore, the step (the step 4) of drying the surface of the unevenly patterned surface to remove the liquid therefrom may be performed after substituting the liquid chemical retained at least on the surfaces of the recessed portions of the uneven pattern with a cleaning liquid (B) different from the liquid chemical after the step (the step 3) of retaining the liquid chemical for forming a protective film at least on the surfaces of the recessed portions of the uneven pattern. Additionally, the step (the step 4) of drying the surface of the unevenly patterned surface to remove the liquid therefrom may be performed after retaining a water-based cleaning liquid formed of a water-based solution at least on the surfaces of the recessed portions of the uneven pattern, through substitution with the cleaning liquid (B). Additionally, the substitution with the cleaning liquid (B) may be omitted in a case where the liquid chemical for forming a protective film is substitutable with the water-based cleaning liquid.

In the present invention, it is essential only that the liquid chemical or the cleaning liquid is retained at least on the surfaces of the recessed portions of the uneven pattern of the wafer; therefore, a cleaning style of the wafer is not particularly limited. Examples of the cleaning style of the wafer are: a sheet cleaning style represented by spin cleaning where the wafer is cleaned one by one in such a manner as to dispose the wafer generally horizontally and rotate it while supplying a liquid to the vicinity of the center of the rotation; and a batch style where a plurality of the wafer are cleaned in a cleaning bath by being immersed therein. Incidentally, the form of the liquid or the cleaning liquid at the time of supplying the liquid or the cleaning liquid at least to the surfaces of the recessed portions of the uneven pattern of the wafer is not particularly limited as far as it is in the form of liquid at time of being retained on the surfaces of the recessed portions, and may be liquid, vapor or the like, for instance.

The liquid chemical for forming a protective film contains a silicon compound (A) represented by the following general formula [1], or a silicon compound (C) represented by the following general formula [4].

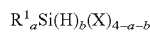  [1]

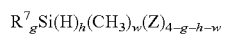  [4]

(In the formula [1], $R^1$ mutually independently represents at least one group selected from monovalent organic groups having a $C_1$-$C_{18}$ hydrocarbon group and monovalent organic groups having a $C_1$-$C_8$ fluoroalkyl chain. X mutually independently represents at least one group selected from halogen groups, monovalent organic groups of which element to be bonded to a silicon element is oxygen or nitrogen, and nitrile group. "a" is an integer of from 1 to 3, "b" is an integer of from 0 to 2, and the total of "a" and "b" is not larger than 3. In the formula [4], $R^7$ mutually independently represents at least one group selected from monovalent organic groups having a $C_2$-$C_{18}$ hydrocarbon group and monovalent organic groups having a $C_2$-$C_8$ fluoroalkyl chain. Z mutually independently represents at least one group selected from halogen groups and monovalent organic groups of which element to be bonded to a silicon element is oxygen. "g" is an integer of from 0 to 3, "h" is an integer of from 0 to 2, and "w" is an integer of from 0 to 2. The total of "g" and "h" is 1 to 3, the total of "g" and "w" is 1 to 3, and the total of "g", "h" and "w" is 1 to 3.)

In the general formulas [1] and [4], examples of the halogen groups represented as X and Z include chloro group, bromo group and the like. Moreover, the monovalent organic groups of which element to be bonded to a silicon element is oxygen or nitrogen may contain a silicon element, a sulfur element, a halogen element and the like in addition to hydrogen, carbon, nitrogen and oxygen element. Examples of the monovalent organic groups of which element to be bonded to a silicon element is nitrogen are isocyanate group, amino group, dialkylamino group, isothiocyanate group, azide group, acetamide group, —N(CH₃)C(O)CH₃, —N(CH₃)C(O)CF₃, —N═C(CH₃)OSi(CH₃)₃, —N═C(CF₃)OSi(CH₃)₃, —NHC(O)OSi(CH₃)₃, —NHC(O)NH—Si(CH₃)₃, imidazole ring (the following formula [8]), oxazolidinone ring (the following formula [9]), morpholine ring (the following formula [10]), —NH—C(O)—Si(CH₃)₃, —N(H)$_{2-\alpha}$(Si(H)$_\beta$R¹$_{3-\beta}$)$_\alpha$ (α is an integer of 1 or 2, and β is an integer of from 0 to 2), and the like. Examples of the monovalent organic groups of which element to be bonded to a silicon element is oxygen include those to be bonded to a silicon element by taking the form of Si—O—C or Si—O—S. Examples of those to be bonded to a silicon element by taking the form of Si—O—C include alkoxy group, —OC(CH₃)═CHC(O)CH₃, —OC(CH₃)═N—Si(CH₃)₃, —OC(CF₃)═N—Si(CH₃)₃, —OC(O)—R¹⁵ (R¹⁵ represents a $C_1$-$C_8$ hydrocarbon group the hydrogen elements of which may partially or entirely be replaced with a fluorine element(s)) and the like. Those to be bonded to a silicon element by taking the form of Si—O—S can be exemplified by —OS(O₂)—R¹⁶ (R¹⁶ represents a $C_1$-$C_8$ hydrocarbon group the hydrogen elements of which may partially or entirely be replaced with a fluorine element(s) and the like. Such a silicon compound (A) or (C) reacts rapidly at X or Z (a reactive moiety) with silanol group serving as a reaction site of the unevenly patterned surface of the silicon wafer, with which the silicon compound (A) or (C) is chemically bonded to silicon elements of the silicon wafer through siloxane bond. With this, it becomes possible to coat a wafer surface with hydrophobic $R^1$ groups or $R^7$ groups, thereby allowing the capillary force of the surfaces of the recessed portions of the wafer to decrease in a short time.

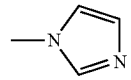  [8]

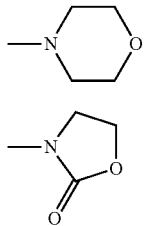

[9]

[10]

Additionally, it is preferable that the number of X of the silicon compound (A) (which is represented by 4-a-b in the general formula [1]) or the number of Z of the silicon compound (C) (which is represented by 4-g-h-w in the general formula [4]) is 1 because the protective film is evenly formed thereby.

Furthermore, it is preferable that $R^1$ in the general formula [1] mutually independently represents at least one group selected from $C_mH_{2m+1}$ (m=1-18) and $C_nF_{2n+1}CH_2CH_2$ (n=1-8) because wettability of the unevenly patterned surface can be more greatly reduced when the protective film is formed thereon. In other words, it is possible to more excellently impart water repellency to the surface. Additionally, it is preferable that "m" ranges from 1 to 8 while "n" ranges from 1 to 6, because the protective film can be formed in a short time on the unevenly patterned surface.

It is preferable that the silicon compound (A) represented by the general formula [1] is alkoxysilane represented by the following general formula [2].

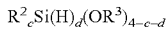

$R^2_cSi(H)_d(OR^3)_{4-c-d}$      [2]

(In the formula [2], $R^2$ mutually independently represents at least one group selected from monovalent organic groups having a $C_1$-$C_{18}$ hydrocarbon group and monovalent organic groups having a $C_1$-$C_8$ fluoroalkyl chain. $R^3$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^3$ may have one or more of carbonyl group, ether bond, ester bond and hydroxyl group. "c" is an integer of from 1 to 3, "d" is an integer of from 0 to 2, and the total of "c" and "d" is not larger than 3.)

Furthermore, it is preferable that $R^7$ in the general formula [4] mutually independently represents at least one group selected from $C_mH_{2m+1}$ (m=2-18) and $C_nF_{2n+1}CH_2CH_2$ (n=2-8) because wettability of the unevenly patterned surface can be more greatly reduced when the protective film is formed thereon. In other words, it is possible to more excellently impart water repellency to the surface. Additionally, it is preferable that "m" ranges from 2 to 8 while "n" ranges from 2 to 6, because the protective film can be formed in a short time on the unevenly patterned surface.

It is preferable that the silicon compound (C) represented by the general formula [4] is alkoxysilane represented by the following general formula [5].

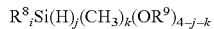

$R^8_iSi(H)_j(CH_3)_k(OR^9)_{4-j-k}$      [5]

(In the formula [5], $R^8$ mutually independently represents at least one group selected from monovalent organic groups having a $C_2$-$C_{18}$ hydrocarbon group and monovalent organic groups having a $C_2$-$C_8$ fluoroalkyl chain. $R^9$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^9$ may have one or more of carbonyl group, ether bond, ester bond and hydroxyl group. "i" is an integer of from 0 to 3, "j" is an integer of from 0 to 2, and "k" is an integer of from 0 to 2. The total of "i" and "j" is 1 to 3, the total of "i" and "k" is 1 to 3, and the total of "i", "j" and "k" is 1 to 3.)

As examples of the alkoxysilane, it is possible to cite: alkylmethoxysilanes such as $CH_3Si(OCH_3)_3$, $C_2H_5Si(OCH_3)_3$, $C_3H_7Si(OCH_3)_3$, $C_4H_9Si(OCH_3)_3$, $C_5H_{11}Si(OCH_3)_3$, $C_6H_{13}Si(OCH_3)_3$, $C_7H_{15}Si(OCH_3)_3$, $C_8H_{17}Si(OCH_3)_3$, $C_9H_{19}Si(OCH_3)_3$, $C_{10}H_{2}Si(OCH_3)_3$, $C_{11}H_{23}Si(OCH_3)_3$, $C_{12}H_{25}Si(OCH_3)_3$, $C_{13}H_{27}Si(OCH_3)_3$, $C_{14}H_{29}Si(OCH_3)_3$, $C_{15}H_{31}Si(OCH_3)_3$, $C_{16}H_{33}Si(OCH_3)_3$, $C_{17}H_{35}Si(OCH_3)_3$, $C_{18}H_{37}Si(OCH_3)_3$, $(CH_3)_2Si(OCH_3)_2$, $C_2H_5Si(CH_3)(OCH_3)_2$, $(C_2H_5)_2Si(OCH_3)_2$, $C_3H_7Si(CH_3)(OCH_3)_2$, $(C_3H_7)_2Si(OCH_3)_2$, $C_4H_9Si(CH_3)(OCH_3)_2$, $(C_4H_9)_2Si(OCH_3)_2$, $C_5H_{11}Si(CH_3)(OCH_3)_2$, $C_6H_{13}Si(CH_3)(OCH_3)_2$, $C_7H_{15}Si(CH_3)(OCH_3)_2$, $C_8H_{17}Si(CH_3)(OCH_3)_2$, $C_9H_{19}Si(CH_3)(OCH_3)_2$, $C_{10}H_{21}Si(CH_3)(OCH_3)_2$, $C_{11}H_{23}Si(CH_3)(OCH_3)_2$, $C_{12}H_{25}Si(CH_3)(OCH_3)_2$, $C_{13}H_{27}Si(CH_3)(OCH_3)_2$, $C_{14}H_{29}Si(CH_3)(OCH_3)_2$, $C_{15}H_{31}Si(CH_3)(OCH_3)_2$, $C_{16}H_{33}Si(CH_3)(OCH_3)_2$, $C_{17}H_{35}Si(CH_3)(OCH_3)_2$, $C_{18}H_{37}Si(CH_3)(OCH_3)_2$, $(CH_3)_3SiOCH_3$, $C_2H_5Si(CH_3)_2OCH_3$, $(C_2H_5)_2Si(CH_3)OCH_3$, $(C_2H_5)_3SiOCH_3$, $C_3H_7Si(CH_3)_2OCH_3$, $(C_3H_7)_2Si(CH_3)OCH_3$, $(C_3H_7)_3SiOCH_3$, $C_4H_9Si(CH_3)_2OCH_3$, $(C_4H_9)_3SiOCH_3$, $C_5H_{11}Si(CH_3)_2OCH_3$, $C_6H_{13}Si(CH_3)_2OCH_3$, $C_7H_{15}Si(CH_3)_2OCH_3$, $C_8H_{17}Si(CH_3)_2OCH_3$, $C_9H_{19}Si(CH_3)_2OCH_3$, $C_{10}H_{21}Si(CH_3)_2OCH_3$, $C_{11}H_{23}Si(CH_3)_2OCH_3$, $C_{12}H_{25}Si(CH_3)_2CH_3$, $C_{13}H_{27}Si(CH_3)_2OCH_3$, $C_{14}H_{29}Si(CH_3)_2OCH_3$, $C_{15}H_{31}Si(CH_3)_2CH_3$, $C_{16}H_{33}Si(CH_3)_2OCH_3$, $C_{17}H_{35}Si(CH_3)_2OCH_3$, $C_{18}H_{37}Si(CH_3)_2OCH_3$, $(CH_3)_2Si(H)OCH_3$, $CH_3Si(H)_2OCH_3$, $(C_2H_5)_2Si(H)OCH_3$, $C_2H_5Si(H)_2OCH_3$, $C_2H_5Si(CH_3)(H)OCH_3$, $(C_3H_7)_2Si(H)OCH_3$ and the like; fluoroalkylmethoxysilanes such as $CF_3CH_2CH_2Si(OCH_3)_3$, $C_2F_5CH_2CH_2Si(OCH_3)_3$, $C_3F_7CH_2CH_2Si(OCH_3)_3$, $C_4F_9CH_2CH_2Si(OCH_3)_3$, $C_5F_{11}CH_2CH_2Si(OCH_3)_3$, $C_6F_{13}CH_2CH_2Si(OCH_3)$ $C_7F_{15}CH_2CH_2Si(OCH_3)_3$, $C_8F_{17}CH_2CH_2Si(OCH_3)_3$, $CF_3CH_2CH_2Si(CH_3)(OCH_3)_2$, $C_2F_5CH_2CH_2Si(CH_3)(OCH_3)_2$, $C_3F_7CH_2CH_2Si(CH_3)(OCH_3)_2$, $C_4F_9CH_2CH_2Si(CH_3)(OCH_3)_2$, $C_5F_{11}CH_2CH_2Si(CH_3)(OCH_3)_2$, $C_6F_{13}CH_2CH_2Si(CH_3)(OCH_3)_2$, $C_7F_{15}CH_2CH_2Si(CH_3)(OCH_3)_2$, $C_8F_{17}CH_2CH_2Si(CH_3)(OCH_3)_2$, $CF_3CH_2CH_2Si(CH_3)_2OCH_3$, $C_2F_5CH_2CH_2Si(CH_3)_2OCH_3$, $C_3F_7CH_2CH_2Si(CH_3)_2OCH_3$, $C_4F_9CH_2CH_2Si(CH_3)_2OCH_3$, $C_5F_{11}CH_2CH_2Si(CH_3)_2OCH_3$, $C_6F_{13}CH_2CH_2Si(CH_3)_2OCH_3$, $C_7F_{15}CH_2CH_2Si(CH_3)_2OCH_3$, $C_8F_{17}CH_2CH_2Si(CH_3)_2OCH_3$, $C_7F_3CH_2CH_2Si(CH_3)(H)OCH_3$ and the like; compounds obtained by substituting the methyl group moiety of the methoxy group of the above-mentioned methoxysilanes with a $C_1$-$C_{18}$ monovalent organic group other than methyl group; and the like.

Additionally, it is more preferable that $R^3$ in the general formula [2] or $R^9$ in the general formula [5] is alkyl group because the protective film can be formed on the unevenly patterned surface in a short time. It is more preferable that $R^3$ or $R^9$ is a straight-chained alkyl group because the protective film can be formed on the unevenly patterned surface in a shorter time. Moreover, the straight-chained alkyl group preferably has a carbon number of from 1 to 6 because the protective film can be formed on the unevenly patterned surface in a much shorter time.

As an acid contained in the liquid chemical, it is possible to cite inorganic acids and organic acids. Examples of an inorganic acid having low water content are hydrogen chloride, sulfuric acid, perchloric acid, phosphoric acid and the like. Examples of an organic acid are methansulfonic acid, benzenesulfonic acid, p-toluenesulfonic acid, trifluoromethanesulfonic acid, acetic acid, trifluoroacetic acid, pentafluoropropionic acid and the like.

As acid, it is also possible to use a Lewis acid. The definition of Lewis acids is discussed in "Dictionary of Science And Chemistry (the 5th edition)", for example. Examples of Lewis acids include acid anhydrides, boron compounds and silicon compounds. Examples of acid anhydrides include: alkanesulfonic acid anhydrides the hydrogen elements of which may partially or entirely be replaced with a fluorine element(s) etc., such as trifluoromethanesulfonic anhydride and the like; carboxylic anhydrides the hydrogen elements of which may partially or entirely be replaced with a fluorine element(s) etc., such as acetic anhydride, trifluoroacetic anhydride, pentafluoropropionic anhydride and the like; and the like. Examples of boron compounds include alkyl borate ester, aryl borate ester, boron tris(trifluoroacetate), trialkoxyboroxin, boron trifluoride and the like. Examples of silicon compounds include chlorosilane, alkyl silyl alkyl sulfonate the hydrogen elements of which may partially or entirely be replaced with a fluorine element(s) etc., alkyl silyl carboxylate the hydrogen elements of which may partially or entirely be replaced with a fluorine element(s) etc., and the like. Incidentally, in a case of using the silicon compound, at least a part of the protective film may be formed of the silicon compound.

Of these compounds, it is particularly preferable to employ Brönsted acid, acid anhydride and a silicon compound such as chlorosilane, alkyl silyl alkyl sulfonate the hydrogen elements of which may partially or entirely be replaced with a fluorine element(s) etc., alkyl silyl carboxylate the hydrogen elements of which may partially or entirely be replaced with a fluorine element(s) etc. and the like, in view of cleanliness. Incidentally, in a case of using the silicon compound, at least a part of the protective film may be formed of the silicon compound.

The above-mentioned base can be exemplified by nitrogen-containing compounds such as ammonia, N,N,N',N'-tetramethylethylenediamine, triethylenediamine, dimethylaniline, alkylamine, pyridine, piperazine, N-alkylmorpholine, $R^{17}_x\text{Si-A}_{4-x}$ (in which $R^{17}$ mutually independently represents a $C_1$-$C_{18}$ monovalent hydrocarbon group the hydrogen elements of which may partially or entirely be replaced with a fluorine element(s) etc., A represents a monovalent organic group of which element to be bonded to a silicon element is nitrogen, the monovalent organic group possibly containing a fluorine element or a silicon element, and "x" is an integer of from 1 to 3) and the like. In view of catalytic ability, ammonia and alkylamine are more preferable. Incidentally, in a case of using $R^{17}_x\text{Si-A}_{4-x}$, at least a part of the protective film may be formed of $R^{17}_x\text{Si-A}_{4-x}$.

In view of catalytic activity, it is preferable that a catalyst contained in the liquid chemical is selected from acids. Of these, the particularly preferable are Brönsted acids that belong to strong acids, anhydrides thereof, alkyl silyl alkyl sulfonate the hydrogen elements of which are partially or entirely replaced with a fluorine element(s) etc., and alkyl silyl carboxylate the hydrogen elements of which are partially or entirely replaced with a fluorine element(s) etc.

In the liquid chemical, the acid or the base that acts as a catalyst preferably has a concentration of from 0.01 to 60 mass % relative to the total amount of 100 mass % of the silicon compound (A) or the silicon compound (C). Smaller addition amounts are to reduce the catalytic effect and therefore not preferable. Meanwhile, excessive addition amounts also do not enhance the catalytic effect, rather than bring about a fear that the wafer surface is eroded or that the catalyst remains on the surface as an impurity. In view of this, the concentration of the catalyst is preferably from 0.05 to 50 mass % relative to the total amount of 100 mass % of the silicon compound (A) or the silicon compound (C).

Furthermore, in the liquid chemical, the silicon compound (A) and the acid, or the silicon compound (C) and the base, may be diluted with a solvent. It is preferable that the total addition amount of the silicon compound (A) and the acid or the total addition amount of the silicon compound (C) and the base is 0.01 to 100 mass % relative to the total amount of 100 mass % of the liquid chemical, because the protective film can be readily and evenly formed at least on the surfaces of the recessed portions of the uneven pattern thereby. If I it is less than 0.01 mass %, the effect of protecting the uneven pattern tends to be insufficient. Meanwhile, excessive addition amounts bring about a fear that the wafer surface is eroded or that they remain on the surface as impurities. It is more preferably from 0.05 to 50 mass %, much more preferably from 0.1 to 30 mass %.

Suitably adoptable examples of the solvent sometimes used for dilution of the liquid chemical are organic solvents such as hydrocarbons, esters, ethers, ketones, halogen element-containing solvents, sulfoxide-based solvents, alcohols, polyalcohol derivatives, nitrogen element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like. Examples of alcohols are methanol, ethanol, propanol, butanol, ethylene glycol, 1,3-propanediol and the like. Examples of the polyalcohol derivatives are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethyl methyl ether, diethylene glycol diethyl ether, diethylene glycol diacetate, triethylene glycol dimethyl ether, ethylene glycol diacetate, ethylene glycol diethyl ether, ethylene glycol dimethyl ether and the like. Examples of the nitrogen element-containing solvents are formamide, N,N-dimethylformamide, N,N-dimethylacetamide, N-methyl-2-pyrrolidone, diethylamine, triethylamine, pyridine and the like.

Additionally, it is preferable to use a nonflammable solvent as the above-mentioned organic solvent since the liquid chemical for forming a protective film becomes nonflammable or increases in flash point thereby reducing the risk of the liquid chemical. Most of the halogen element-containing solvents are nonflammable, so that such a halogen element-containing nonflammable solvent can be preferably used as a nonflammable organic solvent.

In the liquid chemical of the present invention, if a protic solvent is used as a diluent solvent, the effect of the silicon compound (A) and the acid or the effect of the silicon compound (C) and the base is difficult to decrease. Thus highly safe protic solvents, and more specifically, alcohols can be used as the diluent solvent; therefore, it is possible to impart a great safety to the liquid chemical. The silane coupling agent or the surfactant used in Patent Publication 3 (a background technique) is mixed with a protic solvent thereby being reduced in activity, so as to make it difficult to provide a desired water repellency or exhibit a tendency to decrease the throughput. Accordingly, the use of the protic solvent as allowed in the present invention is meaningful.

In a case of providing the liquid chemical to the wafer while rotating the wafer, if the boiling point of the organic solvent is too low, the liquid chemical tends to dry up before wetly spreading over the wafer, which is not preferable. Additionally, in a case where the boiling point is too high, the viscosity of the liquid chemical tends to be excessively increased, which is not preferable. Therefore, it is preferable to use an organic solvent having a boiling point of from 70 to 220° C. As the above-mentioned solvent, when taking the cost or compatibility (a facility for substitution) with other cleaning liquids into account, it is preferable to select 1-propanol or 2-propanol among the above-mentioned alcohols or select diethylene glycol monoethyl ether acetate, ethylene glycol monomethyl ether acetate, propylene glycol monomethyl ether acetate, diethylene glycol dimethyl ether, diethylene glycol ethyl methyl ether, diethylene glycol diethyl ether, diethylene glycol diacetate, triethylene glycol dimethyl ether, ethylene glycol diacetate, ethylene glycol dimethyl ether or cyclohexanone among the organic solvents other than the alcohols.

Additionally, it is preferable that the total amount of the water content in the liquid chemical is not higher than 5000 mass ppm relative to the total amount of the liquid chemical. In a case where the total amount of the water content exceeds 5000 mass ppm, the effect of the silicon compound (A) and the acid or the effect of the silicon compound (C) and the base is so reduced that the protective film becomes difficult to be formed in a short time. Accordingly, the smaller the total amount of the water content of the liquid chemical, the more preferable it is and more particularly, it is preferably not larger than 1000 mass ppm, much more preferably not larger than 500 mass ppm. Furthermore, since a large abundance of water tends to reduce the storage ability of the liquid chemical, a smaller water content is more preferable; therefore the water content is preferably not higher than 200 mass ppm, more preferably not higher than 100 mass ppm. Incidentally, the total amount of water may be 0.1 mass ppm or more. Hence compounds to be contained in the liquid chemical (such as the silicon compound (A), the silicon compound (C), the acid and the base) and compounds that may be contained in the liquid chemical (such as the solvent) are preferably those not containing so much water.

Additionally, concerning a particle measurement in a liquid phase of the liquid chemical conducted by a light scattering type liquid-borne particle detector, it is preferable that the number of particles of larger than 0.5 µm is not more than 100 per 1 mL of the liquid chemical. If the number of particles of larger than 0.5 lam exceeds 100 per 1 mL of the liquid chemical, there arises a fear of inducing a pattern damage due to particles. This may result in reducing the device in yield and reliability and therefore not preferable. Additionally, if the number of particles of larger than 0.5 µm is not more than 100 per 1 mL of the liquid chemical, a cleaning operation to be conducted with a solvent or water after the formation of the protective film can be omitted or shortened, and therefore preferable. Therefore, a smaller number of particles of larger than 0.5 µm per 1 mL of the liquid chemical is more preferable, and more specifically, it is more preferable that the number of particles of larger than 0.5 µm per 1 mL of the liquid chemical is not larger than 10, more preferably not larger than 2. Furthermore, the number of particles of larger than 0.5 µm may be 1 or more per 1 mL of the liquid chemical.

Additionally, it is preferable that the content of each of metal impurities, i.e., the content of each of Na, Mg, K, Ca, Mn, Fe and Cu in the liquid chemical is not more than 100 mass ppb relative to the total amount of the liquid chemical The content of the metal impurity of exceeding 100 mass ppb relative to the total amount of the liquid chemical brings about a fear of increasing a junction leakage current in the device thereby resulting in reducing the device in yield and reliability, which is therefore not preferable. Meanwhile, the content of the metal impurity of not larger than 100 mass ppb relative to the total amount of the liquid chemical is preferable because a cleaning operation to be conducted with use of a solvent or water after the formation of the protective film can be omitted or shortened. Accordingly, a smaller content of the metal impurity is more preferable, and more specifically, it is preferably not larger than 1 mass ppb for each, more preferably not larger than 0.1 mass ppb for each. In addition, the content of each of the metal impurities may be 0.01 mass ppb or more relative to the total amount of the liquid chemical.

In a process for preparing the liquid chemical for forming a protective film by mixing the silicon compound (A) represented by the general formula [1] and the acid, it is preferable to purify at least one of the silicon compound (A) before mixing, the acid before mixing, and a mixed liquid obtained after mixing. Additionally, when the liquid chemical for forming a protective film contains the solvent, the silicon compound (A) before mixing and the acid before mixing may be in a condition of a solution containing the solvent. In this case, the purification may be directed toward at least one of the silicon compound (A) before mixing and a solution thereof, the acid before mixing and a solution thereof, and the mixed liquid obtained after mixing.

Moreover, in a process for preparing the liquid chemical for forming a protective film by mixing the silicon compound (C) represented by the general formula [4] and the base, it is preferable to purify at least one of the silicon compound (C), the base, and a mixed liquid obtained after mixing. Additionally, when the liquid chemical for forming a protective film contains the solvent, the silicon compound (C) before mixing and the base before mixing may be in a condition of a solution containing the solvent. In this case, the purification may be directed toward at least one of the silicon compound (C) before mixing and a solution thereof, the base before mixing and a solution thereof, and the mixed liquid obtained after mixing.

The purification is conducted by using at least one removal means of; removal of water molecular by an adsorbent such as a molecular sieve or by distillation or the like; removal of each element of Na, Mg, K, Ca, Mn, Fe and Cu serving as the metal impurities by an ion-exchange resin, distillation or the like; and removal of a contaminant such as particles by filtration separation. In view of the reactivity of the liquid chemical for forming the protective film and the cleanliness of the wafer, it is preferable to remove the water molecular, remove the metal impurities, and remove the contaminant. The order of these removal means is not limited.

In a process for preparing the liquid chemical for forming a protective film by mixing the silicon compound (A) represented by the general formula [1] and the acid, it is preferable to remove water content from the acid and the solvent before these are mixed with the silicon compound (A). With this, the water content can easily be reduced without losing the activity of the silicon compound (A) and the acid at the time of preparing the liquid chemical for forming a protective film, which is preferable.

In a process for preparing the liquid chemical for forming a protective film by mixing the silicon compound (C) represented by the general formula [4] and the base, it is preferable to remove water content from the base and the solvent before these are mixed with the silicon compound (C). With this, the water content can easily be reduced without losing the activity of the silicon compound (C) and the base at the time of preparing the liquid chemical for forming a protective film, which is preferable.

Additionally, the alkoxysilane and the acid contained in the liquid chemical of the present invention may be obtained by reaction. For instance, those obtained through a reaction between a silicon compound (B) and alcohol as shown in the following formula [3] are acceptable.

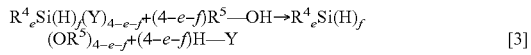

[3]

(In the formula [3], $R^4_e Si(H)_f(Y)_{4-e-f}$ represents a silicon compound (B) and $R^5$—OH represents alcohol. $R^4_e Si(H)_f(OR^5)_{4-e-f}$ represents alkoxysilane obtained by the reaction, and H—Y represents acid. $R^4$ mutually independently represents at least one group selected from monovalent organic groups having a $C_1$-$C_{18}$ hydrocarbon group and monovalent organic groups having a $C_1$-$C_8$ fluoroalkyl chain. $R^5$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^5$ may have one or more of carbonyl group, ether bond, ester bond and hydroxyl group. "e" is an integer of from 1 to 3, "f" is an integer of from 0 to 2, and the total of "e" and "f" is not larger than 3. Additionally, Y mutually independently represents at least one group selected from halogen groups, —OS(O$_2$)—R$^6$ and —OC(O)—R$^6$ (R$^6$ is a $C_1$-$C_8$ hydrocarbon group the hydrogen elements of which may partially or entirely be replaced with a fluorine element(s).)

Additionally, the alkoxysilane and the base contained in the liquid chemical may be obtained by reaction. For instance, those obtained through a reaction between a silicon compound (D) and alcohol as shown in the following formulas [6] and [7] are acceptable.

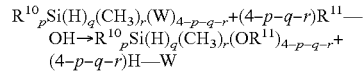

[6]

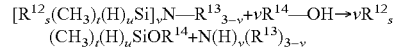

[7]

(In the formula [6], $R^{10}_p Si(H)_q(CH_3)_r(W)_{4-p-q-r}$ represents a silicon compound (D) and $R^{11}$—OH represents alcohol. $R^{10}_p Si(H)_q(CH_3)_r(OR^{11})_{4-p-q-r}$ represents alkoxysilane obtained by the reaction, and H—W represents base. Additionally, in the formula [7], $[R^{12}_s(CH_3)_t(H)_u Si]_v$N—$R^{13}_{3-v}$ represents a silicon compound (D) and $R^{14}$—OH represents alcohol. $R^{12}_s(CH_3)_t(H)_u SiOR^{14}$ represents alkoxysilane obtained by the reaction, and $N(H)_v(R^{13})_{3-v}$ represents base. $R^{10}$ mutually independently represents at least one group selected from monovalent organic groups having a $C_2$-$C_{18}$ hydrocarbon group and monovalent organic groups having a $C_2$-$C_8$ fluoroalkyl chain. $R^{13}$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^{11}$ may have one or more of carbonyl group, ether bond, ester bond and hydroxyl group. $R^{12}$ mutually independently represents at least one group selected from monovalent organic groups having a $C_2$-$C_{18}$ hydrocarbon group and monovalent organic groups having a $C_2$-$C_8$ fluoroalkyl chain. $R^{13}$ mutually independently represents at least one group selected from $C_1$-$C_8$ monovalent organic groups and hydrogen group. $R^{14}$ mutually independently represents at least one group selected from $C_1$-$C_{18}$ monovalent hydrocarbon groups the hydrogen elements of which may partially or entirely be replaced with a fluorine element(s). Incidentally, a hydrocarbon group represented by $R^{14}$ may have one or more of carbonyl group, ether bond, ester bond and hydroxyl group. "p" is an integer of from 0 to 3, "q" is an integer of from 0 to 2, and "r" is an integer of from 0 to 2. The total of "p" and "q" is 1 to 3, the total of "p" and "r" is 1 to 3, and the total of "p", "q" and "r" is 1 to 3. "s" is an integer of from 0 to 3, "t" is an integer of from 0 to 2, and "u" is an integer of from 0 to 2. The total of "s", "t" and "u" is 3. "v" is an integer of from 1 to 3. Furthermore, W mutually independently represents at least one group selected from amino group, dialkylamino group and isocyanate group.)

Incidentally, the alcohol used in the formulas [3], [6] and [7] is to be consumed by reaction but it may be remain in the obtained liquid chemical. An alcohol component that remains by using an excessive amount of alcohol as the starting material of the formulas [3], [6] and [7] may be utilized as a diluent solvent. The alkoxysilane and the acid or base obtained as shown in formulas [3], [6] and [7] is difficult to be reduced in activity by the remaining alcohol. Thus it is possible to use highly safe alcohols as the diluent solvent, so that it is possible to impart a great safety to the liquid chemical. The silane coupling agent or the surfactant used in Patent Publication 3 (a background technique) is mixed with a protic solvent thereby being reduced in activity, so as to make it difficult to provide a desired water repellency or exhibit a tendency to decrease the throughput. Accordingly, the use of the alcohol solvent as allowed in the present invention is meaningful. Incidentally, only if a mixture of alkoxysilane and acid or base is obtained as shown in the right side of the formulas [3], [6] and [7], it is also possible to employ a reaction other than a reaction between the silicon compound (B) and alcohol and that between the silicon compound (D) and alcohol.

Examples of the silicon compound (B) include: alkylchlorosilanes such as $CH_3SiCl_{13}$, $C_2H_5SiCl_3$, $C_3H_7SiCl_3$, $C_4H_9SiCl_3$, $C_5H_{11}SiCl_{13}$, $C_6H_{13}SiCl_3$, $C_7H_{15}SiCl_3$, $C_8H_{17}SiCl_3$, $C_9H_{19}SiCl_3$, $C_{10}H_{21}SiCl_3$, $C_{11}H_{23}SiCl_3$, $C_{12}H_{25}SiCl_3$, $C_{13}H_{27}SiCl_3$, $C_{14}H_{29}SiCl_3$, $C_{15}H_{31}SiCl_3$, $C_{16}H_{33}SiCl_3$, $C_{17}H_{35}SiCl_3$, $C_{18}H_{37}SiCl_3$, $(CH_3)_2SiCl_2$, $C_2H_5Si(CH_3)Cl_2$, $(C_2H_5)_2SiCl_2$, $C_3H_7Si(CH_3)Cl_2$, $(C_3H_7)_2SiCl_2$, $C_4H_9Si(CH_3)Cl_2$, $(C_4H_9)_2SiCl_2$, $C_5H_{11}Si(CH_3)Cl_2$, $C_6H_{13}Si(CH_3)Cl_2$, $C_7H_{15}Si(CH_3)Cl_2$, $C_8H_{17}Si(CH_3)Cl_{12}$, $C_9H_{19}Si(CH_3)Cl_2$, $C_{10}H_{21}Si(CH_3)Cl_2$, $C_7H_{23}Si(CH_3)$ $C_{12}$, $C_{12}H_{25}Si(CH_3)Cl_2$, $C_{13}H_{27}Si(CH_3)Cl_2$, $C_{14}H_{29}Si(CH_3)Cl_2$, $C_{15}H_{31}Si(CH_3)Cl_2$, $C_{16}H_{33}Si(CH_3)Cl_2$, $C_{17}H_{35}Si(CH_3)Cl_2$, $C_{18}H_{37}Si(CH_3)Cl_2$, $(CH_3)_3SiCl$, $C_2H_5Si(CH_3)_2Cl$, $(C_2H_5)_2Si(CH_3)Cl$, $(C_2H_5)_3SiCl$, $C_3H_7Si(CH_3)_2Cl$, $(C_3H_7)_2Si(CH_3)Cl$, $(C_3H_7)_3SiCl$, $C_4H_9Si(CH_3)_2Cl$, $(C_4H_9)_3SiCl$, $C_5H_{11}Si(CH_3)_2Cl$, $C_6H_{13}Si(CH_3)_2Cl$, $C_7H_{15}Si(CH_3)_2Cl$, $C_8H_{17}Si(CH_3)_2Cl$, $C_9H_{19}Si(CH_3)_2Cl$, $C_{10}H_{21}Si(CH_3)_2Cl$, $C_{11}H_{23}Si(CH_3)_2Cl$, $C_{12}H_{25}Si(CH_3)_2Cl$, $C_{13}H_{27}Si(CH_3)_2Cl$, $C_{14}H_{29}Si(CH_3)_2Cl$, $C_{15}H_{31}Si(CH_3)_2Cl$, $C_{16}H_{33}Si(CH_3)_2Cl$, $C_{17}H_{35}Si(CH_3)_2Cl$, $C_{18}H_{37}Si(CH_3)_2Cl$, $(CH_3)_2Si(H)Cl$, $CH_3Si(H)_2Cl$, $(C_2H_5)_2Si(H)Cl$, $C_2H_5Si(H)_2Cl$, $C_2H_5Si(CH_3)(H)Cl$, $(C_3H_7)_2Si(H)Cl$ and the like: fluoroalkylchlorosilanes such as $CF_3CH_2CH_2SiCl_3$, $C_2F_5CH_2CH_2SiCl_3$, $C_3F_7CH_2CH_2SiCl_3$, $C_4F_9CH_2CH_2SiCl_3$, $C_5F_{11}CH_2CH_2SiCl_3$, $C_6F_{13}CH_2CH_2SiCl_3$, $C_7F_{15}CH_2CH_2SiCl_3$, $C_8F_{17}CH_2CH_2SiCl_3$, $CF_3CH_2CH_2Si(CH_3)Cl_2$, $C_2F_5CH_2CH_2Si(CH_3)Cl_2$, $C_3F_7CH_2CH_2Si(CH_3)Cl_2$, $C_4F_9CH_2CH_2Si(CH_3)Cl_2$, $C_5F_{11}CH_2CH_2Si(CH_3)Cl_2$, $C_6F_{13}CH_2CH_2Si(CH_3)Cl_2$, $C_7F_{15}CH_2CH_2Si(CH_3)Cl_2$, $C_8F_{17}CH_2CH_2Si(CH_3)Cl_2$, $CF_3CH_2CH_2Si(CH_3)_2C_1$, $C_2F_5CH_2CH_2Si(CH_3)_2C_1$, $C_3F_7CH_2CH_2Si(CH_3)_2C_1$, $C_4F_9CH_2CH_2Si(CH_3)_2C_1$, $C_5F_{11}CH_2CH_2Si(CH_3)_2C_1$, $C_6F_{13}CH_2CH_2Si(CH_3)_2C_1$, $C_7F_{15}CH_2CH_2Si(CH_3)_2C_1$, $C_8F_{17}CH_2CH_2Si(CH_3)_2C_1$, $CF_3CH_2CH_2Si(CH_3)(H)Cl$ and the like: and compounds obtained by substituting the chloro group of the above-mentioned chlorosilanes with halogen group such as bromo group, $-OS(O_2)-R^6$ or $-OC(O)-R^6$ ($R^6$ represents a $C_1$-$C_8$ hydrocarbon group the hydrogen elements of which may partially or entirely be replaced with a fluorine element(s)).

Examples of the silicon compound (D) include: aminosilanes such as $C_2H_5Si(NH_2)_3$, $C_3H_7Si(NH_2)_3$, $C_4H_9Si(NH_2)_3$, $C_5H_{11}Si(NH_2)_3$, $C_6H_{13}Si(NH_2)_3$, $C_7H_{15}Si(NH_2)_3$, $C_8H_{17}Si(NH_2)_3$, $C_9H_{19}Si(NH_2)_3$, $C_{10}H_{21}Si(NH_2)_3$, $C_{11}H_{23}Si(NH_2)_3$, $C_{12}H_{25}Si(NH_2)_3$, $C_{13}H_{27}Si(NH_2)_3$, $C_{14}H_{29}Si(NH_2)_3$, $C_{15}H_{31}Si(NH_2)_3$, $C_{16}H_{33}Si(NH_2)_3$, $C_{17}H_{35}Si(NH_{12})_3$, $C_{18}H_{37}Si(NH_2)_3$, $C_2H_5Si(CH_3)(NH_2)_2$, $(C_2H_5)_2Si(NH_2)_2$, $C_3H_7Si(CH_3)(NH_2)_2$, $(C_3H_7)_2Si(NH_2)_2$, $C_4H_9Si(CH_3)(NH_2)_2$, $(C_4H_9)_2Si(NH_2)_2$, $C_5H_{11}Si(CH_3)(NH_2)_2$, $C_6H_{13}Si(CH_3)(NH_2)_2$, $C_7H_{15}Si(CH_3)(NH_2)_2$, $C_8H_{17}Si(CH_3)(NH_2)_2$, $C_9H_{19}Si(CH_3)(NH_2)_2$, $C_{10}H_{21}Si(CH_3)(NH_2)_2$, $C_{11}H_{23}Si(CH_3)(NH_2)_2$, $C_{12}H_{25}Si(CH_3)(NH_2)_2$, $C_{13}H_{27}Si(CH_3)(NH_2)_2$, $C_{14}H_{29}Si(CH_3)(NH_2)_2$, $C_{15}H_{31}Si(CH_3)(NH_2)_2$, $C_{16}H_{33}Si(CH_3)(NH_2)_2$, $C_{17}H_{35}Si(CH_3)(NH_2)_2$, $C_{18}H_{37}Si(CH_3)(NH_2)_2$, $C_2H_5Si(CH_3)_2NH_2$, $(C_2H_5)_2Si(CH_3)NH_2$, $(C_2H_5)_3SiNH_2$, $C_3H_7Si(CH_3)_2NH_2$, $(C_3H_7)_2Si(CH_3)NH_2$, $(C_3H_7)_3SiNH_2$, $C_4H_9Si(CH_3)_2NH_2$, $(C_4H_9)_3SiNH_2$, $C_5H_{11}Si(CH_3)_2NH_2$, $C_6H_{13}Si(CH_3)_2NH_2$, $C_7H_{15}Si(CH_3)_2NH_2$, $C_8H_{17}Si(CH_3)_2NH_2$, $C_9H_{19}Si(CH_3)_2NH_2$, $C_{10}H_{21}Si(CH_3)_2NH_2$, $C_{11}H_{23}Si(CH_3)_2NH_2$, $C_{12}H_{25}Si(CH_3)_2NH_{12}$, $C_{13}H_{27}Si(CH_3)_2NH_2$, $C_{14}H_{29}Si(CH_3)_2NH_2$, $C_{15}H_{31}Si(CH_3)_2NH_2$, $C_{16}H_{33}Si(CH_3)_2NH_2$, $C_{17}H_{35}Si(CH_3)_2NH_{12}$, $C_{18}H_{37}Si(CH_3)_2NH_2$, $(CH_3)_2Si(H)NH_2$, $CH_3Si(H)_2NH_2$, $(C_2H_5)_2Si(H)NH_2$, $C_2H_5Si(H)_2NH_2$, $C_2H_5Si(CH_3)(H)NH_2$, $(C_3H_{17})_2Si(H)NH_2$, $CF_3CH_2CH_2Si(NH_2)_3$, $C_2F_5CH_2CH_2Si(NH_2)_3$, $C_3F_7CH_2CH_2Si(NH_2)_3$, $C_4F_9CH_2CH_2Si(NH_2)_3$, $C_5F_{11}CH_2CH_2Si(NH_2)_3$, $C_6F_{13}CH_2CH_2Si(NH_2)_3$, $C_7F_{15}CH_2CH_2Si(NH_2)_3$, $C_8F_{17}CH_2CH_2Si(NH_2)_3$, $CF_3CH_2CH_2Si(CH_3)(NH_2)_2$, $C_2F_5CH_2CH_2Si(CH_3)(NH_2)_2$, $C_3F_7CH_2CH_2Si(CH_3)(NH_2)_2$, $C_4F_9CH_2CH_2Si(CH_3)(NH_2)_2$, $C_5F_{11}CH_2CH_2Si(CH_3)(NH_2)_2$, $C_6F_{13}CH_2CH_2Si(CH_3)(NH_2)_2$, $C_7F_{15}CH_2CH_2Si(CH_3)(NH_2)_2$, $C_8F_{17}CH_2CH_2Si(CH_3)(NH_2)_2$, $C_7F_3CH_2CH_2Si(CH_3)_2NH_2$, $C_2F_5CH_2CH_2Si(CH_3)_2$ $NH_2$, $C_3F_7CH_2CH_2Si(CH_3)_2NH_2$, $C_4F_9CH_2CH_2Si(CH_3)_2$ $NH_2$, $C_5F_{11}CH_2CH_2Si(CH_3)_2NH_2$, $C_6F_{13}CH_2CH_2Si(CH_3)_2$ $NH_2$, $C_7F_{15}CH_2CH_2Si(CH_3)_2NH_2$, $C_8F_{17}CH_2CH_2Si(CH_3)_2$ $NH_2$, $CF_3CH_2CH_2Si(CH_3)(H)NH_2$ and the like: compounds obtained by substituting the amino group of the above-mentioned aminosilanes with dialkylamino group or isocyanate group; and compounds such as $C_2H_5Si(CH_3)_2$ $NHSi(CH_3)_2C_2H_5$, $C_3H_7Si(CH_3)_2NHSi(CH_3)_2C_3H_7$, $C_4H_9Si(CH_3)_2NHSi(CH_3)_2C_4H_9$, $C_5H_{11}Si(CH_3)_2NHSi(CH_3)_2C_5H_{11}$, $C_6H_{13}Si(CH_3)_2NHSi(CH_3)_2C_6H_{13}$, $C_8H_{17}Si(CH_3)_2NHSi(CH_3)_2C_8H_{17}$, $C_6H_5Si(CH_3)_2NHSi(CH_3)_2C_6H_5$, $\{C_2H_5Si(CH_3)_2\}_3N$, $(CH_3)_2HSiNHSi(CH_3)_2H$, $CF_3CH_2CH_2Si(CH_3)_2NHSi(CH_3)_2CH_2CH_2CF_3$, $C_2F_5CH_2CH_2Si(CH_3)_2NHSi(CH_3)_2CH_2CH_2C_2F_5$, $C_3F_7CH_2CH_2Si(CH_3)_2NHSi(CH_3)_2CH_2CH_2C_3F_7$, $C_4F_9CH_2CH_2Si(CH_3)_2NHSi(CH_3)_2CH_2CH_2C_4F_9$, $C_5F_{11}CH_2CH_2Si(CH_3)_2NHSi(CH_3)_2CH_2CH_2C_5F_{11}$, $C_6F_{13}CH_2CH_2Si(CH_3)_2NHSi(CH_3)_2CH_2CH_2C_6F_{13}$, $C_7F_{15}CH_2CH_2Si(CH_3)_2NHSi(CH_3)_2CH_2CH_2C_7F_{15}$, $C_8F_{17}CH_2CH_2Si(CH_3)_2NHSi(CH_3)_2CH_2CH_2C_3F_{17}$, $\{CF_3CH_2CH_2Si(CH_3)_2\}_3N$ and the like.

Examples of the alcohol include: alcohols formed having alkyl group and one hydroxyl group, such as methanol, ethanol, 1-propanol, 2-propanol, 1-butanol, 2-butanol, tert-butanol, isobutanol, 1-pentanol, 1-hexanol, 1-heptanol, 1-octanol and the like; and polyalcohols and derivatives thereof, such as ethylene glycol, glycerine, 1,2-propanediol, 1,3-propanediol, 1,2-butanediol, 1,3-butanediol, 1,2-pentanediol, diethylene glycol monoethyl ether, ethylene glycol monomethyl ether, ethylene glycol monoethyl ether, ethylene glycol monobutyl ether, propylene glycol monomethyl ether, propylene glycol monoethyl ether and the like.

Incidentally, an alcohol having one hydroxyl group at the end of a straight-chained alkyl group is preferably used since the protective film can be formed in a short time. Furthermore, it is particularly preferable that the straight-chained alkyl group has a carbon number of from 1 to 6 because the protective film can be formed in a much shorter time.

Also in a case where the starting material of the liquid chemical for forming a protective film is obtained by reaction as discussed above, the total amount of the water content of the starting material is preferably not higher than 5000 mass ppm relative to the total amount of the starting material. Also in such a case, the smaller the water content of the starting material, the more preferable it is; and more particularly, it is preferably not larger than 1000 mass ppm, much more preferably not larger than 500 mass ppm. Incidentally, the total amount of water of the starting material may be 0.1 mass ppm or more. Hence the starting material to be used for the reaction (such as the silicon compound (B) or the silicon compound (D) and alcohol) are preferably those not containing so much water. More specifically, water content of them each is preferably not larger than 5000 mass ppm. If the water content exceeds 5000 mass ppm, the reactions represented by the formulas [3], [6] and [7] slow down so as to make it difficult to provide a desired liquid chemical for forming a protective film. Hence the starting material to be used for the reaction, such as the silicon compound (B) or the silicon compound (D) and alcohol, preferably has a smaller water content; and more specifically, it is particularly preferable that water content of them each is preferably not larger than 1000 mass ppm, and more preferably not larger than 500 mass ppm. Furthermore, since a large abundance of water tends to reduce the storage ability of the liquid chemical, a smaller water content is more preferable; therefore it is preferably not higher than 200 mass ppm, more preferably not higher than 100 mass ppm. Incidentally, the total amount of water of the starting material may be 0.1 mass ppm or more.

Additionally, also in a case where the starting material of the liquid chemical for forming a protective film is obtained by reaction as discussed above, concerning a particle measurement in a liquid phase of the liquid chemical conducted by a light scattering type liquid-borne particle detector, it is preferable that the number of particles of larger than 0.5 µm is not more than 100 per 1 mL of the liquid chemical. If the number of particles of larger than 0.5 µm exceeds 100 per 1 mL of the liquid chemical, there arises a fear of inducing a pattern damage due to particles. This may result in reducing the device in yield and reliability and therefore not preferable. Additionally, if the number of particles of larger than 0.5 µm is not more than 100 per 1 mL of the liquid chemical, a cleaning operation to be conducted with a solvent or water after the formation of the protective film can be omitted or shortened, and therefore preferable. Therefore, a smaller number of particles of larger than 0.5 µm per 1 mL of the liquid chemical is more preferable, and more specifically, it is more preferable that the number of particles of larger than 0.5 µm per 1 mL of the liquid chemical is not larger than 10, more preferably not larger than 2. Furthermore, the number of particles of larger than 0.5 µm may be 1 or more per 1 mL of the liquid chemical.

Additionally, also in a case where the starting material of the liquid chemical for forming a protective film is obtained by reaction as discussed above, it is preferable that the content of each of metal impurities, i.e., the content of each of Na, Mg, K, Ca, Mn, Fe and Cu in the liquid chemical for forming a protective film is not more than 100 mass ppb relative to the total amount of the liquid chemical. The content of the metal impurity of exceeding 100 mass ppb relative to the total amount of the liquid chemical brings about a fear of increasing a junction leakage current in the device thereby resulting in reducing the device in yield and reliability, which is therefore not preferable. Meanwhile, the content of the metal impurity of not larger than 100 mass ppb relative to the total amount of the liquid chemical is preferable because a cleaning operation to be conducted with use of a solvent or water after the formation of the protective film can be omitted or shortened. Accordingly, a smaller content of the metal impurity is more preferable, and more specifically, it is preferably not larger than 1 mass ppb for each, more preferably not larger than 0.1 mass ppb for each. In addition, the content of each of the metal impurities may be 0.01 mass ppb or more relative to the total amount of the liquid chemical.

In a case of using the silicon compound (B) and alcohol as the starting material of the liquid chemical for forming a protective film, it is preferable to purify at least one of the silicon compound (B) before mixing, the alcohol before mixing, and a mixed liquid obtained after mixing. Additionally, when the liquid chemical for forming a protective film contains a solvent, the silicon compound (B) before mixing and the alcohol before mixing may be in a condition of a solution containing the solvent. In this case, the purification may be directed toward at least one of the silicon compound (B) before mixing and a solution thereof, the alcohol before mixing and a solution thereof, and the mixed liquid obtained after mixing.

In a case of using the silicon compound (D) and alcohol as the starting material of the liquid chemical for forming a protective film, it is preferable to purify at least one of the silicon compound (D) before mixing, the alcohol before mixing, and a mixed liquid obtained after mixing. Additionally, when the liquid chemical for forming a protective film contains a solvent, the purification may be directed toward at least one of the silicon compound (D) before mixing and a solution thereof, the alcohol before mixing and a solution thereof, and the mixed liquid obtained after mixing.

The purification is conducted by using at least one removal means of: removal of water molecular by an adsorbent such as a molecular sieve or by distillation or the like; removal of each element of Na, Mg, K, Ca, Mn, Fe and Cu serving as the metal impurities by an ion-exchange resin, distillation or the like; and removal of a contaminant such as particles by filtration separation. In view of the activity of the liquid chemical for forming the protective film and the cleanliness, it is preferable to remove the water molecular, remove the metal impurities, and remove the contaminant. The order of these removal means is not limited.

Incidentally, it is preferable to remove water content from the alcohol and the solvent before these are mixed with the silicon compound (B) or the silicon compound (D). With this, it becomes possible to decrease the water content without deactivating the compounds produced by preparing the liquid chemical for forming a protective film, such as the silicon compound (A) or the silicon compound (C); and acid or base. Hence it is preferable that each has a smaller water content, a water content of not greater than 10000 mass ppm, and more ideally a water content possibly closer to 0 mass ppm.

Additionally, the liquid chemical of the present invention for forming a protective film may contain additives and the like in addition to: the silicon compound (A) or the silicon compound (C); the acid or the base; and the solvent, within a range of not impairing the object of the present invention. Examples of the additives are oxidizing agents such as hydrogen peroxide, ozone and the like, surfactants, and the like. Additionally, in a case where a part of the uneven pattern of the wafer is formed of a material that the silicon compound (A) or the silicon compound (C) cannot form the protective film thereon, there may be added an additive which allows the material to form the protective film thereon. Furthermore, another acid or base may be added for other than catalytic use.

Additionally, the liquid chemical of the present invention for forming a protective film may be used in such a manner that the starting material stored in a condition separated into two or more is mixed before use. For example in the case of using the silicon compound (A) and the acid as a part of the starting material of the liquid chemical for forming a protective film, the silicon compound (A) and the acid may be independently stored and mixed before use. Incidentally, each of the silicon compound (A) before mixing and the acid before mixing may be in a condition of a solution. Furthermore, the silicon compound (A) and the acid may be stored in the same solution and then mixed with a solution formed containing other materials before use. In the case of using the silicon compound (B) and the alcohol, the silicon compound (B) and the alcohol may be independently stored and mixed before use. Incidentally, each of the silicon compound (B) before mixing and the alcohol before mixing may be in a condition of a solution. Furthermore, the silicon compound (B) and the alcohol may be stored in the same solution and then mixed with a solution formed containing other materials before use.

Similarly, in the case of using the silicon compound (C) and the base, the silicon compound (C) and the base may be independently stored and mixed before use. Incidentally, each of the silicon compound (C) before mixing and the base before mixing may be in a condition of a solution. Furthermore, the silicon compound (C) and the base may be stored in the same solution and then mixed with a solution formed containing other materials before use. In the case of using the silicon compound (D) and the alcohol, the silicon compound (D) and the alcohol may be independently stored and mixed before use. Incidentally, each of the silicon compound (D) before mixing and the alcohol before mixing may be in a condition of a solution. Furthermore, the silicon compound (D) and the alcohol may be stored in the same solution and then mixed with a solution formed containing other materials before use.

Additionally, as the liquid chemical of the present invention for forming a protective film, there can be used those who contain a mixture of; 76 to 99.99 mass % of an organic solvent including at least one kind selected from the group consisting of hydrofluorocarbon, hydrofluoroether, hydrochlorofluorocarbon, alcohol, polyalcohol and derivatives thereof; 0.1 to 20 mass % of silicon compound including at least one kind selected from the group consisting of alkoxysilane and chlorosilane having $C_yH_{2y+1}$ group or $C_yF_{2y+1}CH_2CH_2$ group (y=1-8), trimethylsilyl perfluoroalkylsulfonate and trimethylsilyl trifluoroacetate; 0 to 4 mass % of acid including at least one kind selected from the group consisting of trifluoroacetic acid, trifluoroacetic anhydride, trifluoromethanesulfonic acid and trifluoromethanesulfonic anhydride. Alternatively, it is possible to use those who consist of the mixture only. Incidentally, when the silicon compound consists only of alkoxysilane or when the organic solvent does not contain alcohol, the acid is provided to have a concentration of from 0.01 to 4 mass %. Furthermore, it is also possible to use those who contain a mixture of: 76 to 99.99 mass % of an organic solvent including at least one kind selected from the group consisting of hydrofluorocarbon, hydrofluoroether, hydrochlorofluorocarbon, alcohol, polyalcohol and derivatives thereof, 0.1 to 20 mass % of silicon compound including at least one kind selected from the group consisting of alkoxysilane having $C_yH_{2y+1}$ group or $C_yF_{2y+1}CH_2CH_2$ group (y=2-8), dimethylalkoxysilane and tetramethyldisilazane: 0 to 4 mass % of base including at least one kind selected from the group consisting of ammonia and alkylamine. Alternatively, it is possible to use those who consist of the mixture only. Incidentally, when the silicon compound consists only of alkoxysilane or when the organic solvent does not contain alcohol, the base is provided to have a concentration of from 0.01 to 4 mass %.

In a pattern forming step in which the surface of the wafer is made into a surface having a finely uneven pattern, a resist is applied to the surface of the wafer first of all. Thereafter, the resist is exposed through a resist mask, followed by conducting an etching removal on the exposed resist or an unexposed resist, thereby producing a resist having a desired uneven pattern. Additionally, the resist having an uneven pattern can be obtained also by pushing a mold having a pattern onto the resist. Then, etching is conducted on the wafer. At this time, recessed portions of a resist pattern are etched selectively. Finally, the resist is stripped off thereby obtaining a wafer having a finely uneven pattern.

The wafer having at its surface a finely uneven pattern and containing silicon element at least at a part of the uneven pattern include: wafers on which surface a film containing silicon element such as silicone, silicon oxide, silicon nitride or the like is formed; and wafers containing silicon element such as silicone, silicon oxide, silicon nitride or the like at least at a part of the unevenly patterned surface, when the wafers are formed to have the uneven pattern.

Additionally, also concerning a wafer comprised of a plurality of components including at least one selected from silicon, silicon oxide and silicon nitride, the protective film may be formed on the surface of at least one selected from silicon, silicon oxide and silicon nitride. Examples of the wafer comprised of a plurality of components include: those on which surface at least one selected from silicon, silicon oxide and silicon nitride is formed; and those in which at least a part of the uneven pattern is at least one selected from silicon, silicon oxide and silicon nitride when the wafer is formed to have the uneven pattern. Incidentally, where the protective film is formed with the liquid chemical of the present invention is a surface of a portion of the uneven pattern at which silicon element is contained.

Figure 2:
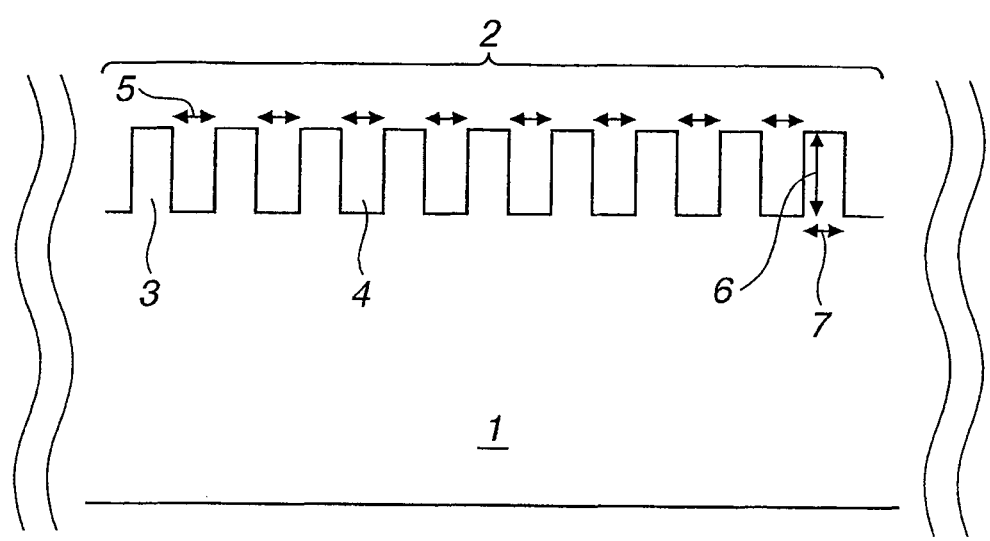
FIG. 2 A view showing a part of a-a' cross section of FIG. 1.

After making the surface of the wafer into a surface having a finely uneven pattern, cleaning of the surface is conducted by using the water-based cleaning liquid, followed by removing the water-based cleaning liquid by drying or the like. If the recessed portions have a small width and projected portions have a large aspect ratio, the pattern collapse is to easily occur. The uneven pattern is defined as shown in FIG. 1 and FIG. 2. FIG. 1 is a schematic plan view of a wafer 1 whose surface is made into a surface having a finely uneven pattern 2. FIG. 2 shows a part of an a-a' cross section in FIG. 1. A width 5 of recessed portions is defined by an interval between adjacent projected portions 3, as shown in FIG. 2. The aspect ratio of projected portions is expressed by dividing a height 6 of the projected portions by a width 7 of the projected portions. The pattern collapse in the cleaning step is to easily occur when the recessed portions have a width of not more than 70 nm, particularly not more than 45 nm and when the aspect ratio is not less than 4, particularly not less than 6.

In the preferable embodiment of the present invention, a surface of a wafer is made into a surface having a finely uneven pattern, followed by providing a water-based cleaning liquid to the surface and retaining the water-based cleaning liquid at least on surfaces of recessed portions of the uneven pattern, as discussed above (the step 1). Then, as also discussed above (the step 2), the water-based cleaning liquid retained at least on the surfaces of the recessed portions of the uneven pattern is substituted with a cleaning liquid (A) which is different from the water-based cleaning liquid. Preferable examples of the cleaning liquid (A) include; the liquid chemical for forming a protective film which liquid chemical is specified by the present invention; water; organic solvents; a mixture of these; a mixture into which at least one kind of acid, alkali, surfactant and an oxidizing agent is mixed; and the like. Additionally, in the case of using other cleaning liquid (A) than the liquid chemical, it is preferable to substitute the cleaning liquid (A) with the liquid chemical for forming a protective film, under a condition where the cleaning liquid (A) is retained at least on the surfaces of the recessed portions of the uneven pattern.

Additionally, examples of the organic solvents, which is one of the preferable examples of the cleaning liquid (A), include hydrocarbons, esters, ethers, ketones, halogen element-containing solvents, sulfoxide-based solvents, alcohols, polyalcohol derivatives, nitrogen element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen element-containing solvents are; perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene and the like; perfluoroethers; perfluoropolyethers; and the like. Examples of the sulfoxide-based solvents are dimethyl sulfoxide and the like. Examples of alcohols are methanol, ethanol, propanol, butanol, ethylene glycol, 1,3-propanediol and the like. Examples of the polyalcohol derivatives are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethyl methyl ether, diethylene glycol diethyl ether, diethylene glycol diacetate, triethylene glycol dimethyl ether, ethylene glycol diacetate, ethylene glycol diethyl ether, ethylene glycol dimethyl ether and the like. Examples of the nitrogen element-containing solvents are formamide, N,N-dimethylformamide, N,N-dimethylacetamide, N-methyl-2-pyrrolidone, diethylamine, triethylamine, pyridine and the like.

Additionally, an acid which may be contained in the cleaning liquid (A) is exemplified by inorganic acid and organic acid. Examples of the inorganic acid include hydrogen fluoride, buffered hydrogen fluoride, sulfuric acid, nitric acid, hydrochloric acid, phosphoric acid and the like. Examples of the organic acid include methansulfonic acid, benzenesulfonic acid, p-toluenesulfonic acid, trifluoromethanesulfonic acid, acetic acid, trifluoroacetic acid, pentafluoropropionic acid and the like. Examples of alkali which may be contained in the cleaning liquid (A) are ammonia, choline and the like. Examples of the oxidizing agent which may be contained in the cleaning liquid (A) include ozone, hydrogen peroxide and the like.

Incidentally, it is preferable that the cleaning liquid (A) is the organic solvent because the liquid chemical for forming a protective film can be provided to the recessed portions without being brought into contact with water. Of these, a organic solvent containing a water-soluble organic solvent (having a solubility of not lower than 5 parts by mass relative to 100 parts by mass of water) is preferable because the substitution of the water-based cleaning liquid with the cleaning liquid (A) is readily achieved thereby. Additionally, it is preferable that the cleaning liquid (A) contains an acid aqueous solution because the protective film is formed in a short time thereby.

Moreover, as the cleaning liquid (A), it is also possible to use a plurality of cleaning liquids. For instance, it is possible to use, as the cleaning liquid (A), two kinds of cleaning liquids, i.e., a cleaning liquid containing an acid aqueous solution or an alkali aqueous solution; and an organic solvent (it is preferable that the organic solvent includes a water-soluble organic solvent). Additionally, it is possible to clean the wafer with the cleaning liquid containing the acid aqueous solution or the alkali aqueous solution, and with the organic solvent in this order. Furthermore, the water-based cleaning liquid may be added, so that it is also possible to clean the wafer with the cleaning liquid containing the acid aqueous solution or the alkali aqueous solution, the water-based cleaning liquid and the organic solvent, in this order.

Figure 3:
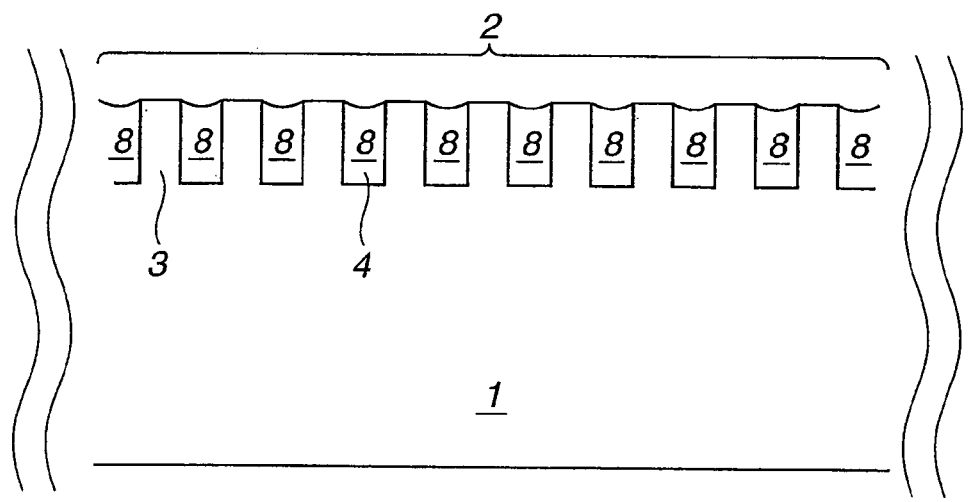
FIG. 3 A schematic view showing a liquid chemical 8 for forming a protective film is retained in recessed portions 4 in a cleaning step.

FIG. 3 is a schematic view showing a condition where the liquid chemical 8 for forming a protective film is retained in the recessed portions 4 in the cleaning step. The wafer of the schematic view of FIG. 3 shows a part of an a-a' cross section in FIG. 1. At the time of the cleaning step, the liquid chemical for forming a protective film is provided onto the wafer 1 in which the uneven pattern 2 is formed. At this time, the liquid chemical is brought into a condition retained in the recessed portions 4 as shown in FIG. 3 so as to form a protective film on the surfaces of the recessed portions 4, thereby imparting water repellency to the surfaces of the recessed portions 4.

When the temperature of the liquid chemical for forming a protective film is increased, the protective film can be formed in a shorter time. A temperature at which an even protective film can be readily formed is not lower than 10° C. and lower than the boiling point of the liquid chemical; and particularly, it is preferably not lower than 15° C. and lower than a temperature 10° C. lower than the boiling point of the liquid chemical. It is preferable that the temperature of the liquid chemical is kept at the above-mentioned temperature even when the liquid chemical is retained at least on the surfaces of the recessed portions of the uneven pattern.

Incidentally, other cleaning liquids may also be kept at a temperature of not lower than 10° C. and lower than the boiling point of the cleaning liquid. In a case where the cleaning liquid (A) contains the acid aqueous solution, more preferably in a case of using a solution containing the acid aqueous solution and an organic solvent having a boiling point of not lower than 100° C., for instance, a temperature of the cleaning liquid increased to the vicinity of the boiling point of the cleaning liquid makes it easy to form the protective film in a short time and therefore preferable.

Furthermore, the step (the step 4) of drying the surface of the unevenly patterned surface to remove the liquid therefrom may be performed after substituting the liquid chemical retained at least on the surfaces of the recessed portions of the uneven pattern with a cleaning liquid (B) different from the liquid chemical after the step (the step 3) of retaining the liquid chemical for forming a protective film at least on the surfaces of the recessed portions of the uneven pattern. Examples of the cleaning liquid (B) include: a water-based cleaning liquid formed of a water-based solution; an organic solvent; a mixture of the water-based cleaning liquid and the organic solvent; a liquid obtained by adding at least one kind of acid, alkali and surfactant to these; a liquid obtained by adding the silicon compound (A)

and an acid or adding the silicon compound (C) and a base (the silicon compound (A) and an acid or the silicon compound (C) and a base are contained in the liquid chemical for forming a protective film) to these at a concentration lower than that in the liquid chemical; and the like.

Additionally, examples of the organic solvents, which is one of the preferable examples of the cleaning liquid (B), include hydrocarbons, esters, ethers, ketones, halogen element-containing solvents, sulfoxide-based solvents, alcohols, polyalcohol derivatives, nitrogen element-containing solvents and the like.

Examples of hydrocarbons are toluene, benzene, xylene, hexane, heptane, octane and the like. Examples of esters are ethyl acetate, propyl acetate, butyl acetate, ethyl acetoacetate and the like. Examples of ethers are diethyl ether, dipropyl ether, dibutyl ether, tetrahydrofuran, dioxane and the like. Examples of ketones are acetone, acetylacetone, methyl ethyl ketone, methyl propyl ketone, methyl butyl ketone, cyclohexanone, isophorone and the like. Examples of the halogen element-containing solvents are: perfluorocarbons such as perfluorooctane, perfluorononane, perfluorocyclopentane, perfluorocyclohexane, hexafluorobenzene and the like; hydrofluorocarbons such as 1,1,1,3,3-pentafluorobutane, octafluorocyclopentane, 2,3-dihydrodecafluoropentane, ZEORORA-H (produced by ZEON CORPORATION) and the like; hydrofluoroethers such as methyl perfluoroisobutyl ether, methyl perfluorobutyl ether, ethyl perfluorobutyl ether, ethyl perfluoroisobutyl ether, ASAHIKLIN AE-3000 (produced by Asahi Glass Co., Ltd.), Novec HFE-7100, Novec HFE-7200, Novec 7300, Novec 7600 (any of these are produced by 3M Limited) and the like; chlorocarbons such as tetrachloromethane and the like; hydrochlorocarbons such as chloroform and the like; chlorofluorocarbons such as dichlorodifluoromethane and the like; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifuoropropene and the like; perfluoroethers; perfluoropolyethers; and the like. Examples of the sulfoxide-based solvents are dimethyl sulfoxide and the like. Examples of alcohols are methanol, ethanol, propanol, butanol, ethylene glycol, 1,3-propanediol and the like. Examples of the polyalcohol derivatives are diethylene glycol monoethyl ether, ethylene glycol monomethyl ether, ethylene glycol monobutyl ether, propylene glycol monomethyl ether, propylene glycol monoethyl ether, diethylene glycol monoethyl ether acetate, ethylene glycol monomethyl ether acetate, ethylene glycol monobutyl ether acetate, propylene glycol monomethyl ether acetate, propylene glycol monoethyl ether acetate, diethylene glycol dimethyl ether, diethylene glycol ethyl methyl ether, diethylene glycol diethyl ether, diethylene glycol diacetate, triethylene glycol dimethyl ether, ethylene glycol diacetate, ethylene glycol diethyl ether, ethylene glycol dimethyl ether and the like. Examples of the nitrogen element-containing solvents are formamide, N,N-dimethylformamide, N,N-dimethylacetamide, N methyl-2-pyrrolidone, diethylamine, triethylamine, pyridine and the like.

Moreover, the step (the step 4) of drying the unevenly patterned surface to remove the liquid therefrom may be performed after retaining the water-based cleaning liquid formed of the water-based solution at least on the surfaces of the recessed portions of the uneven pattern, through the substitution with the cleaning liquid (B).

Additionally, as the cleaning liquid (B), it is also possible to use a plurality of cleaning liquids. For example, it is possible to use two kinds of the cleaning liquid, i.e., the organic solvent (preferably containing a water-soluble organic solvent) and the water-based cleaning liquid.

Examples of the water-based cleaning liquid include liquids containing water as the primary component (for example, liquids having a 50 mass % or more water content), such as water and a mixture obtained by adding at least one kind of an organic solvent, acid and alkali to water. Particularly when water is used as the water-based cleaning liquid, the contact angle θ at least of the surfaces of the recessed portions of the uneven pattern provided with water repellency by the liquid chemical to the liquid is increased so as to decrease a capillary force P of the surfaces of the recessed portions, which is preferable because stains become hard to remain on the wafer surface after drying.

Figure 4:
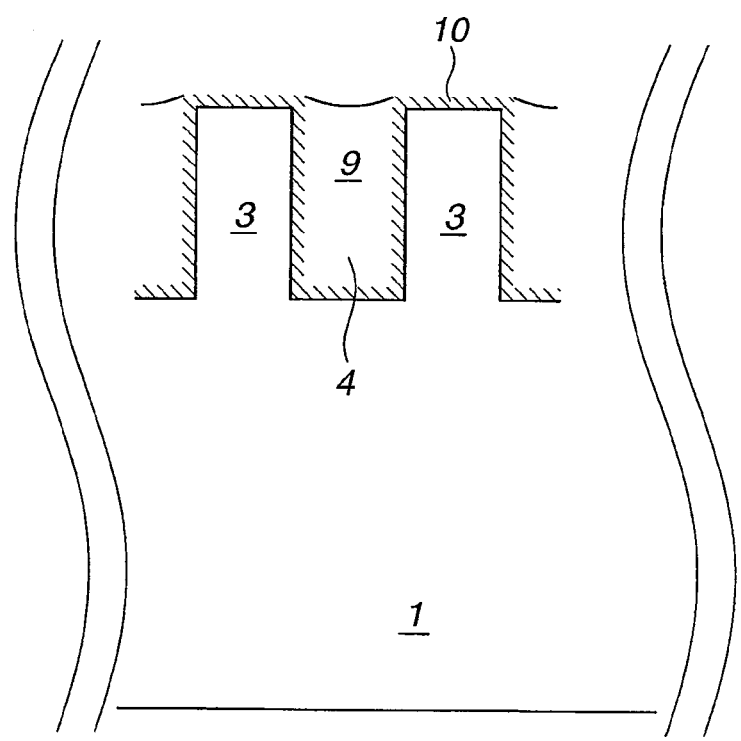
FIG. 4 A schematic view showing a condition where a water-based cleaning liquid is retained in the recessed portions 4 on which the protective film is formed.

A schematic view showing a condition where the water-based cleaning liquid is retained in the recessed portions 4 provided with water repellency by the liquid chemical for forming a protective film is shown in FIG. 4. The wafer as shown in the schematic view of FIG. 4 shows a part of an a-a' cross section of FIG. 1. The unevenly patterned surface is coated with a protective film 10 by the liquid chemical thereby being provided with water repellency. Then, the protective film 10 is retained on the wafer surface, even when a water-based cleaning liquid 9 is removed from the unevenly patterned surface.

When the protective film 10 is formed at least on the surfaces of the recessed portions of the uneven pattern of the wafer by the liquid chemical for forming a protective film, a contact angle of from 60 to 120° is preferable on the assumption that water is retained on the surface, because the pattern collapse becomes difficult to occur thereby. Additionally, the closer to 90° the contact angle is, the smaller the capillary force of the surfaces of the recessed portions becomes, so that the pattern collapse is made further difficult to occur. It is therefore preferable that the contact angle is from 70 to 110°, and more preferably from 75 to 105°. Furthermore, the capillary force is preferably not higher than 1.6 MN/m$^2$. The capillary force of not higher than 1.6 MN/m$^2$ is preferable because the pattern collapse becomes difficult to occur. Additionally, a lower capillary force makes the pattern collapse further difficult to occur, so that a capillary force of not higher than 1.1 MN/m$^2$ is more preferable, and much more preferably not higher than 0.8 MN/m$^2$. Furthermore, it is ideal to put the capillary force close to 0.0 MN/m$^2$ as much as possible by adjusting the contact angle to the cleaning liquid to around 90°.

As discussed above (in the step 4), the step of drying the unevenly patterned surface to remove the liquid therefrom is then performed. In this step, the liquid retained on the unevenly patterned surface is removed by drying. The drying is preferably conducted by a conventionally known drying method such as spin drying, IPA (2-propanol) steam drying, Marangoni drying, heating drying, warm air drying, vacuum drying and the like.

The liquid retained on the unevenly patterned surface and then removed therefrom may be the liquid chemical, the cleaning liquid (B), the water-based cleaning liquid or a mixed liquid of these. Incidentally, the mixed liquid containing the liquid chemical may be a liquid where the liquid chemical is on the way to substitution with the cleaning liquid (B), or a mixed liquid obtained by previously mixing the liquid chemical with a cleaning liquid different from the liquid chemical. Moreover, after the liquid is once removed from the unevenly patterned surface, it is possible to retain at least one selected from the cleaning liquid (B), the water-based cleaning liquid and the mixed liquid of these on the unevenly patterned surface, followed by drying.

As discussed above (in the step 5), the step of removing the protective film 10 is then performed. At the time of removing the protective film, it is effective to cleave C—C bond and C—F bond in the protective film. A method therefor is not particularly limited so long as it is possible to cleave the above-mentioned bonds, and exemplified by: irradiating the wafer surface with light; heating the wafer; exposing the wafer to ozone; irradiating the wafer surface with plasma; subjecting the wafer surface to corona discharge; and the like.

In the case of removing the protective film 10 by light irradiation, it is effective to cleave C—C bond and C—F bond in the protective film 10. On this account, it is preferable to conduct an irradiation with ultraviolet rays having a wavelength of shorter than 340 nm and 240 nm (corresponding to bond energies of C—C bond and C—F bond, i.e., 83 kcal/mol and 116 kcal/mol, respectively). As the light source therefor, there is used a metal halide lamp, a low-pressure mercury lamp, a high-pressure mercury lamp, an excimer lamp, a carbon arc or the like. In the case of using the metal halide lamp, the intensity of the ultraviolet irradiation is preferably not less than 100 mW/cm$^2$, particularly preferably not less than 200 mW/cm$^2$, as a measurement value obtained by the illuminance meter (Intensity meter UM-10 produced by Konica Minolta Sensing, Inc., Light-Receptor UM-360 [Peak sensitivity wavelength: 365 nm, Measured wavelength range: 310 to 400 nm]). Incidentally, an irradiation intensity of less than 100 mW/cm$^2$ takes a long time to remove the protective film 10. Additionally, in the case of using the low-pressure mercury lamp, the ultraviolet irradiation is performed with shorter wavelengths so that removal of the protective film 10 is achieved in a short time even if the intensity is low, which is therefore preferable.

Additionally, in the case of removing the protective film 10 by light irradiation, it is particularly preferable to generate ozone in parallel with decomposing the components of the protective film 10 by ultraviolet rays and then to induce oxidation-volatilization of the components of the protective film 10 by the ozone, since a treatment time is saved thereby. As the light source therefor, the low-pressure mercury lamp, the excimer lamp or the like is used. Moreover, the wafer may be heated while being subjected to light irradiation.

In the case of heating the wafer, heating of the wafer is conducted at 400 to 700° C., preferably at 500 to 700° C. The heating time is preferably kept for 0.5 to 60 minutes, more preferably for 1 to 30 minutes. Additionally, this step may be conducted in combination with ozone exposure, plasma irradiation, corona discharge or the like. Furthermore, the light irradiation may be conducted while heating the wafer.

In the case of exposing the wafer to ozone, it is preferable to expose the wafer surface to ozone generated by ultraviolet irradiation using the low-pressure mercury lamp, low-temperature discharge using high voltages or the like. The wafer may be irradiated with light or heated while being exposed to ozone.

In the step of removing the protective film from the wafer surface, the protective film on the wafer surface can be efficiently removed by combining the light irradiation treatment, the heat treatment, the ozone exposure treatment, the plasma irradiation treatment, the corona discharge treatment and the like.

The liquid chemical of the present invention may be of a one-pack type in which the silicon compound (A) and the acid are mixed from the beginning, or of a two-pack type in which a liquid containing the silicon compound (A) and a liquid containing the acid are mixed before use. Furthermore, a two-pack type of a liquid containing the silicon compound (B) and a liquid containing alcohol is also acceptable. Moreover, the liquid chemical of the present invention may be of a one-pack type in which the silicon compound (C) and the base are mixed from the beginning, or of a two-pack type in which a liquid containing the silicon compound (C) and a liquid containing the base are mixed before use. Furthermore, a two-pack type of a liquid containing the silicon compound (D) and a liquid containing alcohol is also acceptable.

EXAMPLES

A technique of making a wafer surface into a surface having a finely uneven pattern and a technique of substituting a cleaning liquid retained at least in recessed portions of the uneven pattern with another cleaning liquid have been variously studied as discussed in other literatures and the like, and have already been established. Accordingly, in the present invention, evaluations concerning a liquid chemical for forming a protective film were mainly performed. Additionally, as apparent from the equation represented by $P=2\times \gamma \times \cos \theta / S$ ($\gamma$: Surface tension, $\theta$: Contact angle, S: Pattern width) and discussed in the section "BACKGROUND OF THE INVENTION" and the like, a pattern collapse greatly depends on the contact angle of a cleaning liquid to the wafer surface, i.e. the contact angle of a liquid drop and on the surface tension of the cleaning liquid. In a case of a cleaning liquid retained in recessed portions 4 of an uneven pattern 2, the contact angle of a liquid drop and the capillary force acting on the surfaces of the recessed portions (which force is regarded as being equal to the pattern collapse) are in correlation with each other, so that it is also possible to derive the capillary force from the equation and the evaluations made on the contact angle of the liquid drop to a protective film 10. In Examples, water, which is representative of a water-based cleaning liquid, was used as the cleaning liquid.

However, in the case of a wafer having a finely unevenly patterned surface, the pattern is so fine that it is not possible to exactly evaluate the contact angle of the protective film 10 itself, the protective film 10 being formed on the unevenly patterned surface.

An evaluation of the contact angle of waterdrop is conducted by dropping several microliters of waterdrop on a surface of a sample (a substrate) and then by measuring an angle formed between the waterdrop and the substrate surface, as discussed in JIS R 3257 (Testing method of wettability of glass substrate surface). However, in the case of the wafer having a pattern, the contact angle is enormously large. This is because Wenzel's effect or Cassie's effect is caused so that an apparent contact angle of the waterdrop is increased under the influence of a surface shape (roughness) of the substrate upon the contact angle.

In view of the above, in the present invention, the liquid chemical is supplied onto a wafer having a smooth surface to form a protective film thereon, the protective film being regarded as the protective film 10 formed on the surface of a wafer 1 having at its surface a finely uneven pattern 2, thereby performing various evaluations. In the present invention, a silicon wafer having a smooth surface and having a thermal oxide film layer or a silicon nitride layer or a polysilicon layer at the surface was used as the surface having a smooth surface.

Details will be discussed below. Hereinafter, there will be discussed: a method for evaluating a wafer to which a liquid chemical for forming a protective film is supplied; preparation of the liquid chemical for forming a protective film; and results of evaluation made after supplying the liquid chemical for forming a protective film to the wafer.

[Method for Evaluating Wafer to which Liquid Chemical for Forming Protective Film is Provided]

As a method for evaluating a wafer to which a liquid chemical for forming a protective film is provided, the following evaluations (1) to (4) were performed.

(1) Evaluation of Contact Angle of Protective Film Formed on Wafer Surface

About 2 μl of pure water was dropped on a surface of a wafer on which a protective film was formed, followed by measuring an angle (contact angle) formed between the waterdrop and the wafer surface by using a contact angle meter (produced by Kyowa Interface Science Co., Ltd.: CA-X Model).

(2) Evaluation of Capillary Force

The capillary force (the absolute value of P) was obtained by calculating P by using the following equation:

$$P = 2 \times \gamma \times \cos \theta / S$$

where "γ" represents the surface tension, "θ" represents the contact angle, and "S" represents the pattern width.

Incidentally, the present example was made on the assumption that a wafer formed having a line-and-space pattern the line width (the width of the recessed portions) of which was 45 nm, as an example of a pattern shape. The pattern having a line width of 45 nm tends to cause its collapse in a case where a cleaning liquid used when a gas-liquid interface passes through the uneven pattern is water, while the pattern collapse tends to be difficult to occur in a case of 2-propanol. In the case where the pattern width is 45 nm and the wafer surface is silicon oxide and where the cleaning liquid is 2-propanol (Surface tension: 22 mN/m, Contact angle to silicon oxide: 1°), the capillary force is 0.98 MN/m². On the other hand, in a case of water (Surface tension: 72 mN/m, Contact angle to silicon oxide: 2.5°) having the largest surface tension among liquids other than mercury, the capillary force results in 3.2 MN/m². The capillary force is preferably not higher than 1.6 MN/m², more preferably not higher than 1.1 MN/m², and particularly preferably not higher than 0.8 MN/m².

(3) Removability of Protective Film

Under the following conditions, a sample was irradiated with UV rays from a metal halide lamp for 2 hours. A sample on which waterdrop had a contact angle of not larger than 30° after the irradiation was classified as acceptable one (indicated in Tables with A).

Lamp: M015-L312 produced by EYE GRAPHICS CO., LTD. (Intensity: 1.5 kW)
Illuminance: 128 mW/cm² as a measurement value obtained under the following conditions
Measuring Apparatus: Ultraviolet Intensity Meter (UM-10 produced by Konica Minolta Sensing, Inc.)
Light-Receptor: UM-360 (Light-Receptive Wavelength: 310-400 nm, Peak Wavelength: 365 nm)
Measuring Mode: Irradiance Measurement (4) Evaluation of Surface Smoothness of Wafer after Removing Protective Film The surface was observed by atomic force microscope (produced by Seiko Instruments Inc.: SPI3700, 2.5 micrometer square scan), and then the centerline average surface roughness Ra (nm) was calculated. Incidentally, "Ra" is a three-dimensionally enlarged one obtained by applying the centerline average roughness defined by JIS B 0601 to a measured surface and is calculated as "an average value of absolute values of difference from standard surface to designated surface" from the following equation. If the Ra value of the wafer surface after removing the protective film was not larger than 1 nm, the wafer surface was regarded as not being eroded by the cleaning and regarded as not leaving residues of the protective film thereon, and therefore classified as an acceptable one (indicated in Tables with A).

$$Ra = \frac{1}{S_0} \int_{Y_T}^{Y_B} \int_{X_L}^{X_R} |F(X, Y) - Z_0| \, dX \, dY$$

In the above equation, $X_L$ and $X_R$, and $Y_B$ and $Y_T$ represent a measuring range in the X coordinate and the Y coordinate, respectively. $S_0$ represents an area obtained on the assumption that the measured surface is ideally flat, and is a value obtained by $(X_R-X_L) \times (Y_B-Y_T)$. Additionally, $F(X,Y)$ represents the height at a measured point $(X,Y)$. $Z_0$ represents the average height within the measured surface.

Example 1

(1) Preparation of Liquid Chemical for Forming Protective Film

A mixture of: 3 g of semiconductor-grade trimethylmethoxysilane $[(CH_3)_3SiOCH_3]$ that serves as a silicon compound (A); 1 g of semiconductor-grade trifluoromethanesulfonic acid $[CF_3SO_3H]$ that serves as an acid; and 96 g of a semiconductor-grade fluorine-based solvent (Novec HFE-7100 produced by 3M Limited: Hydrofluoroether) that serves as an organic solvent was prepared to obtain a liquid chemical for forming a protective film. Furthermore, a water content was removed from the liquid chemical by using a molecular sieve 4 A (produced by UNION SHOWA K.K.). Thereafter, metal impurities were removed from the liquid chemical by using an ion-exchange resin (IonKleen™ SL Purifier produced by Pall Corporation), followed by removing particles from the liquid chemical by filtration separation (Optimizer produced by Nihon Entegris K.K.), thereby conducting purification. The water content in the liquid chemical after purification was measured by using a Karl Fischer's moisture meter (produced by Kyoto Electronics Manufacturing Co., Ltd., ADP-511 model). As a result, the water content in the liquid chemical after purification was 8 mass ppm relative to the total amount of the liquid chemical. Additionally, the content of metal impurities in the liquid chemical after purification was measured by using an inductively coupled plasma mass spectroscope (produced by Yokogawa Analytical Systems Inc., Agilent 7500cs model). As a result, the contents of metal impurities (such as elements of Na, Mg, K, Ca, Mn, Fe and Cu) after purification were Na=3 mass ppb, Mg=0.03 mass ppb, K=0.4 mass ppb, Ca=6 mass ppb, Mn=0.003 mass ppb, Fe=0.2 mass ppb and Cu=0.04 mass ppb, respectively. Additionally, as a particle measurement in a liquid phase of the liquid chemical conducted by using a light scattering type liquid-borne particle detector, the number of particles of larger than 0.5 μm was measured by a light scattering type liquid-borne particle measuring device (produced by RION Co., Ltd., KS-42AF model). As a result, the number of particles of larger than 0.5 μm was 3 per 1 mL of the liquid chemical. Also in examples later than the present example, purification was similarly conducted, and additionally there was used a liquid chemical confirmed to have: a water content of not higher than 5000 mass ppm relative to the total amount of the liquid chemical;

the content of metal impurities including elements of Na, Mg, K, Ca, Mn, Fe and Cu is not higher than 100 mass ppb for each, relative to the total amount of the liquid chemical; and 100 or less particles of larger than 0.5 μm, per 1 mL of the liquid chemical.

(2) Cleaning of Silicon Wafer

A silicon wafer having a smooth thermal oxide film (a silicon wafer on which surface a thermal oxide film of 1 μm thickness was formed) was immersed in 1 mass % hydrogen fluoride aqueous solution at room temperature for 2 minutes. The wafer is thereafter immersed in 3 mass % aqueous hydrogen peroxide at 80° C. for 2 minutes. Moreover, the wafer is immersed in pure water at room temperature for 1 minute, and then immersed in 2-propanol (iPA) at room temperature for 1 minute.

(3) Surface Treatment of Surface of Silicon Wafer, Using Liquid Chemical for Forming Protective Film The silicon wafer was immersed in the liquid chemical for forming a protective film (the liquid chemical having been prepared in the above "(1) Preparation of Liquid Chemical for forming Protective Film" section) at 20° C. for 5 minutes. Subsequently, the silicon wafer was immersed in iPA for 1 minute and then immersed in pure water serving as a water-based cleaning liquid for 1 minute. Finally, the silicon wafer was taken out of the pure water, followed by spraying air thereon to remove the pure water from the surface.

As a result of evaluating the thus obtained wafer in a manner discussed in the above [Method for Evaluating Wafer to which Liquid Chemical for forming Protective Film is provided] section, a wafer having an initial contact angle of smaller than 10° before the surface treatment was confirmed to have a contact angle of 86° after the surface treatment as shown in Table 1, with which it was confirmed that a water-repellency-imparting effect was exhibited. Additionally, as a result of calculating the capillary force in the case where water is retained, by using the equation discussed in the "Evaluation of Capillary Force" section, the capillary force was so small as to be 0.2 MN/m². Moreover, the contact angle of the wafer after UV irradiation was smaller than 10°, with which it was confirmed that removal of the protective film was achieved. Furthermore, a Ra value of the wafer after UV irradiation was smaller than 0.5 nm, so that it was confirmed that the wafer was not eroded at the time of cleaning and that residues of the protective film did not remain after UV irradiation.

TABLE 1

| | Liquid Chemical for forming Protective Film Starting Material | | | | | |
|---|---|---|---|---|---|---|
| | Silicon | Concentration of Silicon | Acid | | Organic Solvent | |
| | Compound (A) | Compound (A) [mass %] | Acid | Concentration [mass %] | Kind | Alcohol Solvent |
| Example 1 | $(CH_3)_3Si-OCH_3$ | 3 | $CF_3SO_2H$ | 1 | HFE-7100 | — |
| Example 2 | $(CH_3)_3Si-OCH_3$ | 3 | $CF_3SO_2H$ | 1 | CTFP | — |
| Example 3 | $(CH_3)_3Si-OCH_3$ | 3 | $CF_3SO_2H$ | 1 | DCTFP | — |
| Example 4 | $(CH_3)_3Si-OCH_3$ | 3 | $CF_3SO_2H$ | 1 | PGMEA | — |
| Example 5 | $(CH_3)_3Si-OCH_3$ | 3 | $CF_3SO_2H$ | 1 | HFE-7100/PGMEA | — |
| Example 6 | $(CH_3)_3Si-OCH_3$ | 3 | $CF_3SO_2H$ | 1 | CTFP/PGMEA | — |
| Example 7 | $(CH_3)_3Si-OCH_3$ | 3 | $CF_3SO_2H$ | 1 | DCTFP/PGMEA | — |
| Example 8 | $(CH_3)_3Si-OCH_3$ | 3 | $CF_3SO_2H$ | 1 | HFE-7100/iPA | iPA |
| Example 9 | $(CH_3)_3Si-OCH_3$ | 3 | $CF_3SO_2H$ | 1 | CTFP/iPA | iPA |
| Example 10 | $(CH_3)_3Si-OCH_3$ | 3 | $CF_3SO_2H$ | 1 | DCTFP/iPA | iPA |
| Example 11 | $(CH_3)_3Si-OCH_3$ | 5 | $CF_3SO_2H$ | 1 | PGMEA | — |
| Example 12 | $(CH_3)_3Si-OCH_3$ | 5 | $CF_3SO_2H$ | 1 | HFE-7100/PGMEA | — |
| Example 13 | $(CH_3)_3Si-OCH_3$ | 5 | $CF_3SO_2H$ | 1 | HFE-7100/iPA | iPA |
| Example 14 | $(CH_3)_3Si-OCH_3$ | 10 | $CF_3SO_2H$ | 1 | PGMEA | — |
| Example 15 | $(CH_3)_3Si-OCH_3$ | 10 | $CF_3SO_2H$ | 1 | HFE-7100/PGMEA | — |
| Example 16 | $(CH_3)_3Si-OCH_3$ | 10 | $CF_3SO_2H$ | 1 | HFE-7100/iPA | iPA |
| Example 17 | $(CH_3)_3Si-OCH_3$ | 3 | $CF_3SO_2H$ | 0.1 | PGMEA | — |
| Example 18 | $(CH_3)_3Si-OCH_3$ | 3 | $CF_3SO_2H$ | 0.1 | HFE-7100/PGMEA | — |
| Example 19 | $(CH_3)_3Si-OCH_3$ | 3 | $CF_3SO_2H$ | 0.1 | HFE-7100/iPA | iPA |
| Example 20 | $(CH_3)_3Si-OCH_3$ | 3 | $CF_3SO_2H$ | 1 | HFE-7100/PGMEA | — |
| Example 21 | $(CH_3)_3Si-OCH_3$ | 3 | $CF_3SO_2H$ | 1 | HFE-7100/iPA | iPA |
| Example 22 | $(CH_3)_3Si-OCH_3$ | 3 | $H_3SO_4$ | 1 | PGMEA | — |
| Example 23 | $(CH_3)_3Si-OCH_3$ | 3 | $H_3SO_4$ | 1 | HFE-7100/PGMEA | — |
| Example 24 | $(CH_3)_3Si-OCH_3$ | 3 | $H_3SO_4$ | 1 | HFE-7100/iPA | iPA |
| Example 25 | $(CH_3)_3Si-OCH_3$ | 3 | $(CH_3)_3SiOSO_3CF_3$ | 1 | PGMEA | — |
| Example 26 | $(CH_3)_3Si-OCH_3$ | 3 | $(CH_3)_3SiOSO_3CF_3$ | 1 | HFE-7100/PGMEA | — |
| Example 27 | $(CH_3)_3Si-OCH_3$ | 3 | $(CH_3)_3SiOSO_3CF_3$ | 1 | HFE-7100/iPA | iPA |
| Example 28 | $(CH_3)_3Si-OCH_3$ | 3 | $(CF_3SO_3)_3O$ | 1 | PGMEA | — |

TABLE 1-continued

| | | | | | | |
|---|---|---|---|---|---|---|
| Example 29 | (CH₃)₃Si—OCH₃ | 3 | (CF₃SO₃)₃O | 1 | HFE-7100/PGMEA | — |
| Example 30 | (CH₃)₃Si—OCH₃ | 3 | (CF₃SO₃)₃O | 1 | HFE-7100/iPA | iPA |

| | Organic Solvent | Treatment after Surface Treatment with Liquid Chemical for forming Protective Film | | | |
|---|---|---|---|---|---|
| | Alcohol Concentration [mass %] | Drying | Cleaning with Solvent | Cleaning with Water | Drying |
| Example 1 | — | Not Performed | Performed | Performed | Performed |
| Example 2 | — | Not Performed | Performed | Performed | Performed |
| Example 3 | — | Not Performed | Performed | Performed | Performed |
| Example 4 | — | Not Performed | Performed | Performed | Performed |
| Example 5 | — | Not Performed | Performed | Performed | Performed |
| Example 6 | — | Not Performed | Performed | Performed | Performed |
| Example 7 | — | Not Performed | Performed | Performed | Performed |
| Example 8 | 5 | Not Performed | Performed | Performed | Performed |
| Example 9 | 5 | Not Performed | Performed | Performed | Performed |
| Example 10 | 5 | Not Performed | Performed | Performed | Performed |
| Example 11 | — | Not Performed | Performed | Performed | Performed |
| Example 12 | — | Not Performed | Performed | Performed | Performed |
| Example 13 | 5 | Not Performed | Performed | Performed | Performed |
| Example 14 | — | Not Performed | Performed | Performed | Performed |
| Example 15 | — | Not Performed | Performed | Performed | Performed |
| Example 16 | 5 | Not Performed | Performed | Performed | Performed |
| Example 17 | — | Not Performed | Performed | Performed | Performed |
| Example 18 | — | Not Performed | Performed | Performed | Performed |
| Example 19 | 5 | Not Performed | Performed | Performed | Performed |
| Example 20 | — | Not Performed | Performed | Performed | Performed |
| Example 21 | 5 | Not Performed | Performed | Performed | Performed |
| Example 22 | — | Not Performed | Performed | Performed | Performed |
| Example 23 | — | Not Performed | Performed | Performed | Performed |
| Example 24 | 5 | Not Performed | Performed | Performed | Performed |
| Example 25 | — | Not Performed | Performed | Performed | Performed |
| Example 26 | — | Not Performed | Performed | Performed | Performed |
| Example 27 | 5 | Not Performed | Performed | Performed | Performed |
| Example 28 | — | Not Performed | Performed | Performed | Performed |
| Example 29 | — | Not Performed | Performed | Performed | Performed |
| Example 30 | 5 | Not Performed | Performed | Performed | Performed |

| | Evaluation Results | | | | |
|---|---|---|---|---|---|
| | Initial Contact Angle [°] | Contact Angle after Surface Treatment [°] | Capillary Force [MM/m³] <Calculated Value> | Removability of Protective Film (Contact Angle [°]) | Surface Smoothness (Ra [nm]) |
| Example 1 | <10 | 88 | 0.2 | A (<10) | A (<0.5) |
| Example 2 | <10 | 88 | 0.2 | A (<10) | A (<0.5) |
| Example 3 | <10 | 88 | 0.2 | A (<10) | A (<0.5) |
| Example 4 | <10 | 84 | 0.3 | A (<10) | A (<0.5) |
| Example 5 | <10 | 88 | 0.2 | A (<10) | A (<0.5) |
| Example 6 | <10 | 84 | 0.3 | A (<10) | A (<0.5) |
| Example 7 | <10 | 88 | 0.2 | A (<10) | A (<0.5) |
| Example 8 | <10 | 70 | 1.1 | A (<10) | A (<0.5) |
| Example 9 | <10 | 70 | 1.1 | A (<10) | A (<0.5) |
| Example 10 | <10 | 70 | 1.1 | A (<10) | A (<0.5) |
| Example 11 | <10 | 88 | 0.2 | A (<10) | A (<0.5) |
| Example 12 | <10 | 88 | 0.2 | A (<10) | A (<0.5) |
| Example 13 | <10 | 72 | 1 | A (<10) | A (<0.5) |
| Example 14 | <10 | 88 | 0.1 | A (<10) | A (<0.5) |
| Example 15 | <10 | 88 | 0.1 | A (<10) | A (<0.5) |
| Example 16 | <10 | 78 | 0.3 | A (<10) | A (<0.5) |
| Example 17 | <10 | 80 | 0.3 | A (<10) | A (<0.5) |
| Example 18 | <10 | 80 | 0.3 | A (<10) | A (<0.5) |
| Example 19 | <10 | 88 | 1.2 | A (<10) | A (<0.5) |
| Example 20 | <10 | 78 | 0.3 | A (<10) | A (<0.5) |
| Example 21 | <10 | 88 | 1.2 | A (<10) | A (<0.5) |
| Example 22 | <10 | 70 | 1.1 | A (<10) | A (<0.5) |
| Example 23 | <10 | 78 | 0.3 | A (<10) | A (<0.5) |
| Example 24 | <10 | 83 | 1.2 | A (<10) | A (<0.5) |
| Example 25 | <10 | 84 | 0.3 | A (<10) | A (<0.5) |
| Example 26 | <10 | 88 | 0.2 | A (<10) | A (<0.5) |
| Example 27 | <10 | 70 | 1.1 | A (<10) | A (<0.5) |
| Example 28 | <10 | 84 | 0.3 | A (<10) | A (<0.5) |

| | | | | | |
|---|---|---|---|---|---|
| Example 29 | <10 | 88 | 0.2 | A (<10) | A (<0.5) |
| Example 30 | <10 | 78 | 0.3 | A (<10) | A (<0.5) |

Examples 2 to 57

Upon modifying the conditions employed in Example 1 (i.e., the silicon compound (A) (or the silicon compound (C)), the concentration of the silicon compound (A), the acid, the concentration of the acid, the base, the organic solvent, the procedures carried out after the surface treatment using the liquid chemical for forming a protective film, and the like), a surface treatment was conducted on wafers, followed by evaluation of these. Results are shown in Tables 1 and 2.

TABLE 2

| | Liquid Chemical for forming Protective Film Starting Material | | | | | |
|---|---|---|---|---|---|---|
| | Silicon Compound (A) | Concentration of Silicon Compound (A) [mass %] | Acid | Concentration [mass %] | Organic Solvent Kind | Alcohol Solvent |
| Example 31 | $(CH_3)_3Si-OCH_3$ | 3 | $CF_3SO_3H$ | 1 | HFE-7100 | — |
| Example 32 | $(CH_3)_3Si-OCH_3$ | 3 | $CF_3SO_3H$ | 1 | HFE/7100/PGMEA | — |
| Example 33 | $(CH_3)_3Si-OCH_3$ | 3 | $CF_3SO_3H$ | 1 | HFE-7100/iPA | iPA |
| Example 34 | $(CH_3)_3Si-OCH_3$ | 3 | $CF_3SO_3H$ | 1 | CTFP/PGMEA | — |
| Example 35 | $(CH_3)_3Si-OCH_3$ | 3 | $CF_3SO_3H$ | 1 | HFE-7100 | — |
| Example 36 | $(CH_3)_3Si-OCH_3$ | 3 | $CF_3SO_3H$ | 1 | HFE/7100/PGMEA | — |
| Example 37 | $(CH_3)_3Si-OCH_3$ | 3 | $CF_3SO_3H$ | 1 | HFE-7100/iPA | iPA |
| Example 38 | $(CH_3)_3Si-OCH_3$ | 3 | $CF_3SO_3H$ | 1 | CTFP/PGMEA | — |
| Example 39 | $(CH_3)_3Si-OCH_3$ | 3 | $CF_3SO_3H$ | 1 | HFE-7100 | — |
| Example 40 | $(CH_3)_3Si-OCH_3$ | 3 | $CF_3SO_3H$ | 1 | HFE/7100/PGMEA | — |
| Example 41 | $(CH_3)_3Si-OCH_3$ | 3 | $CF_3SO_3H$ | 1 | HFE-7100/iPA | iPA |
| Example 42 | $(CH_3)_3Si-OCH_3$ | 3 | $CF_3SO_3H$ | 1 | CTFP/PGMEA | — |
| Example 43 | $(CH_3)_3Si-OCH_3$ | 3 | $CF_3SO_3H$ | 1 | HFE/7100/PGMEA | — |
| Example 44 | $(CH_3)_3Si-OCH_3$ | 3 | $CF_3SO_3H$ | 1 | HFE-7100/iPA | iPA |
| Example 45 | $(CH_3)_3Si-OCH_3$ | 3 | $CF_3SO_3H$ | 1 | HFE/7100/PGMEA | — |
| Example 46 | $(CH_3)_3Si-OCH_3$ | 3 | $CF_3SO_3H$ | 1 | HFE-7100/iPA | iPA |
| Example 47 | $(CH_3)_3Si-OCH_3$ | 3 | $CF_3SO_3H$ | 1 | HFE/7100/PGMEA | — |
| Example 48 | $(CH_3)_3Si-OCH_3$ | 3 | $CF_3SO_3H$ | 1 | HFE-7100/iPA | iPA |
| Example 49 | $(CH_3)_2Si-Cl$ | 3 | $CF_3SO_3H$ | 1 | HFE/7100/PGMEA | — |
| Example 50 | $(CH_3)_2Si-Cl$ | 3 | $CF_3SO_3H$ | 1 | HFE/7100/PGMEA | — |
| Example 51 | $(CH_3)_2Si-Cl$ | 3 | $H_2SO_4$ | 1 | HFE/7100/PGMEA | — |
| Example 52 | $(CH_3)_2Si-Cl$ | 3 | $(CH_3)_3SiOSO_2CF_3$ | 1 | HFE/7100/PGMEA | — |
| Example 53 | $(CH_3)_2Si-Cl$ | 3 | $(CF_3SO_2)_2O$ | 1 | HFE/7100/PGMEA | — |
| Example 54 | $(CH_3)_2Si(H)-OCH_3CH_3$ | 10 | $CF_3SO_3H$ | 1 | HFE-7100/iPA | iPA |
| Example 55 | $(CH_3)_2Si(H)-OCH_3CH_3$ | 10 | $CF_3SO_3H$ | 1 | HFE-7100/iPA | iPA |
| Example 56 | $(CH_3)_2Si-OSi(CH_2)_2$ | 10 | $CF_3SO_3H$ | 1 | HFE/7100/PGMEA | — |
| Example 57 | $(CH_3)_2Si-OSi(CH_2)_2$ | 10 | $CF_3SO_3H$ | 1 | HFE-7100/iPA | iPA |

| | Organic Solvent Alcohol Concentration [mas] | Drying | Treatment after Surface Treatment with Liquid Chemical for forming Protective Film | | |
|---|---|---|---|---|---|
| | | | Cleaning with Solvent | Cleaning with Water | Drying |
| Example 31 | — | Not Performed | Performed | Performed | Performed |
| Example 32 | — | Not Performed | Performed | Performed | Performed |
| Example 33 | 5 | Not Performed | Performed | Performed | Performed |
| Example 34 | — | Not Performed | Performed | Performed | Performed |
| Example 35 | — | Not Performed | Performed | Performed | Performed |
| Example 36 | — | Not Performed | Performed | Performed | Performed |
| Example 37 | 5 | Not Performed | Performed | Performed | Performed |
| Example 38 | — | Not Performed | Performed | Performed | Performed |
| Example 39 | — | Not Performed | Performed | Performed | Performed |
| Example 40 | — | Not Performed | Performed | Performed | Performed |
| Example 41 | 5 | Not Performed | Performed | Performed | Performed |
| Example 42 | — | Not Performed | Performed | Performed | Performed |
| Example 43 | — | Not Performed | Performed | Performed | Performed |
| Example 44 | 5 | Not Performed | Performed | Performed | Performed |
| Example 45 | — | Not Performed | Performed | Performed | Performed |
| Example 46 | 5 | Not Performed | Performed | Performed | Performed |
| Example 47 | — | Not Performed | Performed | Performed | Performed |
| Example 48 | 5 | Not Performed | Performed | Performed | Performed |

TABLE 2-continued

| | | | | | |
|---|---|---|---|---|---|
| Example 49 | — | Not Performed | Performed | Performed | Performed |
| Example 50 | — | Not Performed | Performed | Performed | Performed |
| Example 51 | — | Not Performed | Performed | Performed | Performed |
| Example 52 | — | Not Performed | Performed | Performed | Performed |
| Example 53 | — | Not Performed | Performed | Performed | Performed |
| Example 54 | 5 | Not Performed | Performed | Performed | Performed |
| Example 55 | 5 | Not Performed | Performed | Performed | Performed |
| Example 56 | — | Not Performed | Performed | Performed | Performed |
| Example 57 | 5 | Not Performed | Performed | Performed | Performed |

| | Evaluation Results | | | | |
|---|---|---|---|---|---|
| | Initial Contact Angle [*] | Contact Angle after Surface Treatment [*] | Capillary Force [MM/m$^3$] <Calculated Value> | Removability of Protective Film (Contact Angle [*]) | Surface Smoothness (Ra [mm]) |
| Example 31 | <10 | 86 | 0.2 | A (<10) | A (<0.5) |
| Example 32 | <10 | 86 | 0.2 | A (<10) | A (<0.5) |
| Example 33 | <10 | 70 | 1.1 | A (<10) | A (<0.5) |
| Example 34 | <10 | 86 | 0.2 | A (<10) | A (<0.5) |
| Example 35 | <10 | 84 | 0.3 | A (<10) | A (<0.5) |
| Example 36 | <10 | 86 | 0.2 | A (<10) | A (<0.5) |
| Example 37 | <10 | 86 | 1.2 | A (<10) | A (<0.5) |
| Example 38 | <10 | 84 | 0.3 | A (<10) | A (<0.5) |
| Example 39 | <10 | 86 | 0.2 | A (<10) | A (<0.5) |
| Example 40 | <10 | 84 | 0.3 | A (<10) | A (<0.5) |
| Example 41 | <10 | 70 | 1.1 | A (<10) | A (<0.5) |
| Example 42 | <10 | 84 | 0.3 | A (<10) | A (<0.5) |
| Example 43 | <10 | 85 | 0.2 | A (<10) | A (<0.5) |
| Example 44 | <10 | 85 | 1.2 | A (<10) | A (<0.5) |
| Example 45 | <10 | 84 | 0.3 | A (<10) | A (<0.5) |
| Example 46 | <10 | 70 | 1.1 | A (<10) | A (<0.5) |
| Example 47 | <10 | 84 | 0.3 | A (<10) | A (<0.5) |
| Example 48 | <10 | 70 | 1.1 | A (<10) | A (<0.5) |
| Example 49 | <10 | 80 | 0.6 | A (<10) | A (<0.5) |
| Example 50 | <10 | 76 | 0.7 | A (<10) | A (<0.5) |
| Example 51 | <10 | 75 | 0.7 | A (<10) | A (<0.5) |
| Example 52 | <10 | 82 | 0.4 | A (<10) | A (<0.5) |
| Example 53 | <10 | 82 | 0.4 | A (<10) | A (<0.5) |
| Example 54 | <10 | 74 | 0.9 | A (<10) | A (<0.5) |
| Example 55 | <10 | 85 | 1.3 | A (<10) | A (<0.5) |
| Example 56 | <10 | 84 | 0.3 | A (<10) | A (<0.5) |
| Example 57 | <10 | 85 | 1.3 | A (<10) | A (<0.5) |

Incidentally, in Tables, "(CH$_3$)$_3$SiCl" means trimethylchlorosilane, "(CH$_3$)$_2$Si(H)OCH$_2$CH$_3$" means dimethylethoxysilane, and "(CH$_3$)$_3$SiOSi(CH$_3$)$_3$" means hexamethyldisiloxane.

Additionally, in Tables, "CTFP" means 1-chloro-3,3,3-trifluoropropene. "DCTFP" means cis-1,2-dichloro-3,3,3-trifluoropropene. "PGMEA" means propylene glycol monomethyl ether acetate. "HFE-7100/PGMEA" means a mixed solvent in which the mass ratio of HFE-7100 to PGMEA is 95:5. "CTFP/PGMEA" means a mixed solvent in which the mass ratio of CTFP to PGMEA is 95:5. "DCTFP/PGMEA" means a mixed solvent in which the mass ratio of DCTFP to PGMEA is 95:5. "HFE-7100/iPA" means a mixed solvent of HFE-7100 and iPA and provides the liquid chemical for forming a protective film with a concentration of alcohol (an alcohol concentration) of 5 mass %. "CTFP/iPA" means a mixed solvent of CTFP and iPA and provides the liquid chemical for forming a protective film with a concentration of alcohol (an alcohol concentration) of 5 mass %. "DCTFP/iPA" means a mixed solvent of DCTFP and iPA and provides the liquid chemical for forming a protective film with a concentration of alcohol (an alcohol concentration) of 5 mass %.

Moreover, in Tables, "CH$_3$SO$_3$H" means methanesulfonic acid serving as acid. "H$_2$SO$_4$" means 98% sulfuric acid serving as acid. "(CH$_3$)$_3$SiOSO$_2$CF$_3$" means trimethylsilyl trifluoromethanesulfonate serving as acid. "(CF$_3$SO$_2$)$_2$O" means trifluoromethanesulfonic anhydride serving as acid. "DEA" means diethylamine serving as base.

In Examples 31 to 34, after immersing the silicon wafer in the liquid chemical for forming a protective film in "(3) Surface Treatment of Surface of Silicon Wafer, using Liquid Chemical for forming Protective Film", the silicon wafer was immersed in pure water for 1 minute. The silicon wafer was finally taken out of the pure water, followed by spraying air thereon to remove the pure water from the surface.

In Examples 35 to 38, after immersing the silicon wafer in the liquid chemical for forming a protective film in "(3) Surface Treatment of Surface of Silicon Wafer, using Liquid Chemical for forming Protective Film", the silicon wafer was immersed in iPA for 1 minute. The silicon wafer was finally taken out of the iPA, followed by spraying air thereon to remove the iPA from the surface.

In Examples 39 to 42, the silicon wafer was taken out of the liquid chemical for forming a protective film in "(3) Surface Treatment of Surface of Silicon Wafer, using Liquid Chemical for forming Protective Film", followed by spraying air thereon to remove the liquid chemical for forming a protective film from the surface.

In Examples 43 and 44, after immersing the silicon wafer in the liquid chemical for forming a protective film in "(3) Surface Treatment of Surface of Silicon Wafer, using Liquid Chemical for forming Protective Film", air was sprayed to remove the liquid chemical for forming a protective film from the surface. Thereafter, the silicon wafer was immersed in pure water for 1 minute. The silicon wafer was finally taken out of the pure water, followed by spraying air thereon to remove the pure water from the surface.

In Examples 45 and 46, after immersing the silicon wafer in the liquid chemical for forming a protective film in "(3) Surface Treatment of Surface of Silicon Wafer, using Liquid Chemical for forming Protective Film", air was sprayed to remove the liquid chemical for forming a protective film from the surface. Thereafter, the silicon wafer was immersed in iPA for 1 minute. The silicon wafer was finally taken out of the iPA, followed by spraying air thereon to remove the iPA from the surface.

In Examples 47 and 48, after immersing the silicon wafer in the liquid chemical for forming a protective film in "(3) Surface Treatment of Surface of Silicon Wafer, using Liquid Chemical for forming Protective Film", air was sprayed to remove the liquid chemical for forming a protective film from the surface. Thereafter, the silicon wafer was immersed in iPA for 1 minute and then immersed in pure water for 1 minute. The silicon wafer was finally taken out of the pure water, followed by spraying air thereon to remove the pure water from the surface.

Example 58

The procedure of Example 1 was repeated with the exception that 3 g of trimethylchlorosilane [$(CH_3)_3SiCl$] that serves as a silicon compound (B) and a mixed solvent of 5 g of 2-propanol (iPA) and 92 g of HFE-7100 which mixed solvent serves as an organic solvent were mixed to initiate a reaction as represented by the following equation thereby obtaining a liquid chemical for forming a protective film, the liquid chemical containing trimethylisopropoxysilane as the silicon compound (A), hydrogen chloride as the acid, and HFE-7100 as the organic solvent. Results of the evaluations are as shown in Table 3. The contact angle obtained after the surface treatment was 68° and therefore a water-repellency-imparting effect was exhibited. Additionally, the capillary force obtained in the case where water was retained was so small as to be 1.2 $MN/m^2$. Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

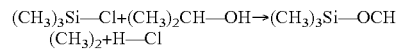
$(CH_3)_3Si-Cl+(CH_3)_2CH-OH \rightarrow (CH_3)_3Si-OCH(CH_3)_2+H-Cl$

TABLE 3

| | Liquid Chemical for forming Protective Film Starting Material | | | | |
|---|---|---|---|---|---|
| | | Concentration | Organic Solvent | | |
| | Silicon Compound (B) | of Silicon Compound (B) [mass %] | Kind | Alcohol Solvent | Alcohol Concentration [mass %] |
| Example 58 | $(CH_3)_3Si-Cl$ | 3 | HFE-7100/iPA | iPA | 5 |
| Example 59 | $(CH_3)_3Si-Cl$ | 1 | HFE-7100/iPA | iPA | 5 |
| Example 60 | $(CH_3)_3Si-Cl$ | 10 | HFE-7100/iPA | iPA | 5 |
| Example 61 | $(CH_3)_3Si-Cl$ | 50 | HFE-7100/iPA | iPA | 5 |
| Example 62 | $(CH_3)_3Si-Cl$ | 50 | iPA | iPA | 50 |
| Example 63 | $(CH_3)_3Si-Cl$ | 10 | iPA | iPA | 90 |
| Example 64 | $(CH_3)_3Si-Cl$ | 3 | CTFP/iPA | iPA | 5 |
| Example 65 | $(CH_3)_3Si-Cl$ | 3 | DCTFP/iPA | iPA | 5 |
| Example 66 | $(CH_3)_3Si-Cl$ | 3 | HFE-7100/nPA | nPA | 5 |
| Example 67 | $(CH_3)_3Si-Cl$ | 10 | HFE-7100/nPA | nPA | 5 |
| Example 68 | $(CH_3)_3Si-Cl$ | 50 | nPA | nPA | 50 |
| Example 69 | $(CH_3)_3Si-Cl$ | 10 | nPA | nPA | 90 |
| Example 70 | $(CH_3)_3Si-Cl$ | 3 | HFE-7100/Ethanol | Ethanol | 5 |
| Example 71 | $(CH_3)_3Si-Cl$ | 10 | Ethanol | Ethanol | 90 |
| Example 72 | $(CH_3)_3Si-Cl$ | 10 | HFE-7100/PDO | PDO | 5 |
| Example 73 | $(CH_3)_3Si-Cl$ | 10 | HFE-7100/PGME | PGME | 5 |
| Example 74 | $(CH_3)_3Si-Cl$ | 10 | HFE-7100/iPA | iPA | 5 |
| Example 75 | $(CH_3)_3Si-Cl$ | 10 | HFE-7100/nPA | nPA | 5 |
| Example 76 | $(CH_3)_3Si-Cl$ | 10 | nPA | nPA | 90 |
| | Liquid Chemical for forming Protective Film | | | | |
| | Silicon Compound (A) for med in Liquid Chemical | | | Acid for med in Liquid Chemical | |
| Example 58 | $(CH_3)_3Si-OCH(CH_3)_2$ | | | HCl | |
| Example 59 | $(CH_3)_3Si-OCH(CH_3)_2$ | | | HCl | |
| Example 60 | $(CH_3)_3Si-OCH(CH_3)_2$ | | | HCl | |
| Example 61 | $(CH_3)_3Si-OCH(CH_3)_2$ | | | HCl | |
| Example 62 | $(CH_3)_3Si-OCH(CH_3)_2$ | | | HCl | |
| Example 63 | $(CH_3)_3Si-OCH(CH_3)_2$ | | | HCl | |
| Example 64 | $(CH_3)_3Si-OCH(CH_3)_2$ | | | HCl | |
| Example 65 | $(CH_3)_3Si-OCH(CH_3)_2$ | | | HCl | |
| Example 66 | $(CH_3)_3Si-OCH(CH_3)_2$ | | | HCl | |
| Example 67 | $(CH_3)_3Si-OCH(CH_3)_2$ | | | HCl | |
| Example 68 | $(CH_3)_3Si-OCH(CH_3)_2$ | | | HCl | |
| Example 69 | $(CH_3)_3Si-OCH(CH_3)_2$ | | | HCl | |

TABLE 3-continued

| | | |
|---|---|---|
| Example 70 | $(CH_3)_3Si—OCH(CH_3)_2$ | HCl |
| Example 71 | $(CH_3)_3Si—OCH(CH_3)_2$ | HCl |
| Example 72 | $(CH_3)_3Si—OCH_3H(CH)CH_3CH_3CH_3$ | HCl |
| | $(CH_3)_3Si—OCH(CH_3CH)CH_3OH_3OH_3$ | HCl |
| | $(CH_3)_3Si—OCH_3CH(OSi(CH_3))_3CH_3CH_3CH_3$ | HCl |
| Example 73 | $(CH_3)_3Si—OCH(CH_3)CH_3OCH_3$ | HCl |
| Example 74 | $(CH_3)Si(H)—OCH(CH_3)_3$ | HCl |
| Example 75 | $(CH_3)_3Si(H)—OCH_3CH_3CH_3$ | HCl |
| Example 76 | $(CH_3)_3Si(H)—OCH_3CH_3CH_3$ | HCl |

| | Treatment after Surface Treatment with Liquid Chemical for forming Protective Film | | | |
|---|---|---|---|---|
| | Drying | Cleaning with Solvent | Cleaning with Water | Drying |
| Example 58 | Not Performed | Performed | Performed | Performed |
| Example 59 | Not Performed | Performed | Performed | Performed |
| Example 60 | Not Performed | Performed | Performed | Performed |
| Example 61 | Not Performed | Performed | Performed | Performed |
| Example 62 | Not Performed | Performed | Performed | Performed |
| Example 63 | Not Performed | Performed | Performed | Performed |
| Example 64 | Not Performed | Performed | Performed | Performed |
| Example 65 | Not Performed | Performed | Performed | Performed |
| Example 66 | Not Performed | Performed | Performed | Performed |
| Example 67 | Not Performed | Performed | Performed | Performed |
| Example 68 | Not Performed | Performed | Performed | Performed |
| Example 69 | Not Performed | Performed | Performed | Performed |
| Example 70 | Not Performed | Performed | Performed | Performed |
| Example 71 | Not Performed | Performed | Performed | Performed |
| Example 72 | Not Performed | Performed | Performed | Performed |
| Example 73 | Not Performed | Performed | Performed | Performed |
| Example 74 | Not Performed | Performed | Performed | Performed |
| Example 75 | Not Performed | Performed | Performed | Performed |
| Example 76 | Not Performed | Performed | Performed | Performed |

| | Evaluation Results | | | | |
|---|---|---|---|---|---|
| | Initial Contact Angle [*] | Contact Angle after Surface Treatment [*] | Capillary Force [MM/m$^2$] <Calculated Value> | Removability of Protective Film (Contact Angle [*]) | Surface Smoothness (Ra [mm]) |
| Example 58 | <10 | 68 | 1.2 | A (<10) | A (<0.5) |
| Example 59 | <10 | 66 | 1.3 | A (<10) | A (<0.5) |
| Example 60 | <10 | 70 | 1.1 | A (<10) | A (<0.5) |
| Example 61 | <10 | 76 | 0.8 | A (<10) | A (<0.5) |
| Example 62 | <10 | 74 | 0.9 | A (<10) | A (<0.5) |
| Example 63 | <10 | 70 | 1.1 | A (<10) | A (<0.5) |
| Example 64 | <10 | 70 | 1.1 | A (<10) | A (<0.5) |
| Example 65 | <10 | 70 | 1.1 | A (<10) | A (<0.5) |
| Example 66 | <10 | 72 | 1 | A (<10) | A (<0.5) |
| Example 67 | <10 | 76 | 0.8 | A (<10) | A (<0.5) |
| Example 68 | <10 | 80 | 0.6 | A (<10) | A (<0.5) |
| Example 69 | <10 | 78 | 0.7 | A (<10) | A (<0.5) |
| Example 70 | <10 | 72 | 1 | A (<10) | A (<0.5) |

TABLE 3-continued

| | | | | | |
|---|---|---|---|---|---|
| Example 71 | <10 | 78 | 0.7 | A (<10) | A (<0.5) |
| Example 72 | <10 | 64 | 1.4 | A (<10) | A (<0.5) |
| Example 73 | <10 | 66 | 1.3 | A (<10) | A (<0.5) |
| Example 74 | <10 | 80 | 0.6 | A (<10) | A (<0.5) |
| Example 75 | <10 | 82 | 0.4 | A (<10) | A (<0.5) |
| Example 76 | <10 | 80 | 0.6 | A (<10) | A (<0.5) |

Examples 59 to 73

Upon modifying the conditions employed in Example 58 (i.e., the concentration of the silicon compound (B), the alcohol, the concentration of the alcohol, the organic solvent and the like), a surface treatment was conducted on wafers, followed by evaluation of these. Results are shown in Table 3.

In Tables, "HFE-7100/iPA" means a mixed solvent of HFE-7100 and iPA and provides the starting material with an alcohol concentration of 5 mass %. "CTFP/iPA" means a mixed solvent of CTFP and iPA and provides the starting material with an alcohol concentration of 5 mass %. "DCTFP/iPA" means a mixed solvent of DCTFP and iPA and provides the starting material with an alcohol concentration of 5 mass %. "nPA" means 1-propanol. "HFE-7100/nPA" means a mixed solvent of HFE-7100 and nPA and provides the starting material with an alcohol concentration of 5 mass %. "HFE-7100/ethanol" means a mixed solvent of HFE-7100 and ethanol and provides the starting material with an alcohol concentration of 5 mass %. "PDO" means 1,2-pentanediol. "HFE-7100/PDO" means a mixed solvent of HFE-7100 and PDO and provides the starting material with an alcohol concentration of 5 mass %. "PGME" means propylene glycol monomethyl ether. "HFE-7100/PGME" means a mixed solvent of HFE-7100 and PGME and provides the starting material with an alcohol concentration of 5 mass %.

Example 74

The procedure of Example 60 was repeated with the exception that dimethylchlorosilane [(CH$_3$)$_2$Si(H)Cl] was used as the silicon compound (B) in the liquid chemical for forming a protective film to initiate a reaction as represented by the following equation thereby obtaining a liquid chemical for forming a protective film, the liquid chemical containing dimethylisopropoxysilane as the silicon compound (A). Results of the evaluation are as shown in Table 3. The contact angle obtained after the surface treatment was 80° and therefore a water-repellency-imparting effect was exhibited. Additionally, the capillary force obtained in the case where water was retained was so small as to be 0.6 MN/m². Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

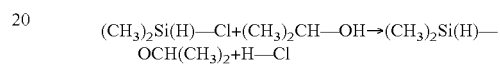

Examples 75 and 76

Upon modifying the conditions employed in Example 74 (i.e., the alcohol, the concentration of the alcohol, the organic solvent and the like), a surface treatment was conducted on wafers, followed by evaluation of these. Results are shown in Table 3.

Example 7

The procedure of Example 75 was repeated with the exception that 10 g of tetramethyldisilazane [(CH$_3$)$_2$Si(H)—NH—Si(H)(CH$_3$)$_2$] that serves as a silicon compound (D) in the liquid chemical for forming a protective film and a mixed solvent of 5 g of 1-propanol (nPA) and 85 g of HFE-7100 which mixed solvent serves as an organic solvent were mixed to initiate a reaction as represented by the following equation thereby obtaining a liquid chemical for forming a protective film, the liquid chemical containing dimethylpropoxysilane as the silicon compound (C), ammonia as the base, and HFE-7100 as the organic solvent. Results of the evaluation are as shown in Table 4. The contact angle obtained after the surface treatment was 70° and therefore a water-repellency-imparting effect was exhibited. Additionally, the capillary force obtained in the case where water was retained was so small as to be 1.1 MN/m². Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

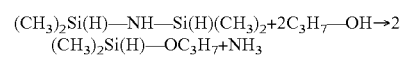

TABLE 4

| | Liquid Chemical for forming Protective Film Starting Material | | | | |
|---|---|---|---|---|---|
| | Silicon Compound (B) or (D) | Concentration of Silicon Compound (B) or (D) [mass %] | Organic Solvent Kind | Alcohol Solvent | Alcohol Concentration [mass %] |
| Example 77 | (CH$_3$)$_2$Si(H)—NHSi(H)(CH$_3$)$_2$ | 10 | HFE-7100/nPA | nPA | 5 |
| Example 78 | C$_3$HS$_3$i(CH$_3$)$_3$—Cl | 10 | HFE-7100/iPA | iPA | 5 |
| Example 79 | C$_3$HS$_3$i(CH$_3$)$_3$—Cl | 10 | HFE-7100/nPA | nPA | 5 |
| Example 80 | C$_3$HS$_3$i(CH$_3$)$_3$—Cl | 10 | nPA | nPA | 90 |
| Example 81 | C$_3$HS$_3$i(CH$_3$)$_3$—Cl | 10 | HFE-7100/iPA | iPA | 5 |
| Example 82 | C$_3$HS$_3$i(CH$_3$)$_3$—Cl | 10 | HFE-7100/nPA | nPA | 5 |
| Example 83 | C$_3$HS$_3$i(CH$_3$)$_3$—Cl | 10 | nPA | nPA | 90 |
| Example 84 | CF$_3$C$_3$H$_3$Si(CH$_3$)$_3$—Cl | 10 | HFE-7100/iPA | iPA | 5 |
| Example 85 | CF$_3$C$_3$H$_3$Si(CH$_3$)$_3$—Cl | 10 | HFE-7100/nPA | nPA | 5 |
| Example 86 | CF$_3$C$_3$H$_3$Si(CH$_3$)$_3$—Cl | 10 | nPA | nPA | 90 |
| Example 87 | CF$_3$C$_3$H$_3$Si(CH$_3$)$_3$—Cl | 10 | HFE-7100/iPA | iPA | 5 |
| Example 88 | CF$_3$C$_3$H$_3$Si(CH$_3$)$_3$—Cl | 10 | HFE-7100/nPA | nPA | 5 |
| Example 89 | CF$_3$C$_3$H$_3$Si(CH$_3$)$_3$—Cl | 10 | nPA | nPA | 90 |
| Example 90 | CF$_3$C$_3$H$_3$Si(CH$_3$)$_3$—Cl | 10 | HFE-7100/nPA | nPA | 5 |
| Example 91 | CF$_3$C$_3$H$_3$Si(CH$_3$)$_3$—Cl | 10 | HFE-7100/nPA | nPA | 5 |

| | Liquid Chemical for forming Protective Film Starting Material (A) or (C) for med in Liquid Chemical | Acid or Base formed in Liquid Chemical | Treatment after Surface Treatment with Liquid Chemical for forming Protective Film Drying |
|---|---|---|---|
| Example 77 | (CH$_3$)$_3$Si(H)—OCH$_3$CH$_3$CH$_3$ | NH$_3$ | Not Performed |
| Example 78 | C$_3$H$_3$Si(CH$_3$)$_3$—OCH(CH$_3$)$_3$ | HCl | Not Performed |
| Example 79 | C$_3$H$_3$Si(CH$_3$)$_3$—OCH(CH$_3$)$_3$ | HCl | Not Performed |
| Example 80 | C$_3$H$_3$Si(CH$_3$)$_3$—OCH(CH$_3$)$_3$ | HCl | Not Performed |
| Example 81 | CF$_3$(CF$_3$)C$_3$H$_3$Si(CH$_3$)$_3$—OCH$_3$CH$_3$CH$_3$ | HCl | Not Performed |
| Example 82 | CF$_3$(CF$_3$)C$_3$H$_3$Si(CH$_3$)$_3$—OCH$_3$CH$_3$CH$_3$ | HCl | Not Performed |
| Example 83 | CF$_3$(CF$_3$)C$_3$H$_3$Si(CH$_3$)$_3$—OCH$_3$CH$_3$CH$_3$ | HCl | Not Performed |
| Example 84 | CF$_3$(CF$_3$)C$_3$H$_3$Si(CH$_3$)$_3$—OCH$_3$CH$_3$CH$_3$ | HCl | Not Performed |
| Example 85 | CF$_3$(CF$_3$)C$_3$H$_3$Si(CH$_3$)$_3$—OCH$_3$CH$_3$CH$_3$ | HCl | Not Performed |
| Example 86 | CF$_3$(CF$_3$)C$_3$H$_3$Si(CH$_3$)$_3$—OCH$_3$CH$_3$CH$_3$ | HCl | Not Performed |
| Example 87 | CF$_3$(CF$_3$)C$_3$H$_3$Si(CH$_3$)$_3$—OCH$_3$CH$_3$CH$_3$ | HCl | Not Performed |
| Example 88 | CF$_3$(CF$_3$)C$_3$H$_3$Si(CH$_3$)$_3$—OCH$_3$CH$_3$CH$_3$ | HCl | Not Performed |
| Example 89 | CF$_3$(CF$_3$)C$_3$H$_3$Si(CH$_3$)$_3$—OCH$_3$CH$_3$CH$_3$ | HCl | Not Performed |
| Example 90 | CF$_3$(CF$_3$)C$_3$H$_3$Si(CH$_3$)$_3$—OCH$_3$CH$_3$CH$_3$ | HCl | Not Performed |
| Example 91 | CF$_3$(CF$_3$)C$_3$H$_3$Si(CH$_3$)$_3$—OCH$_3$CH$_3$CH$_3$ | HCl | Not Performed |

| | Treatment after Surface Treatment with Liquid Chemical for forming Protective Film | | | Not Performed | | | | |
|---|---|---|---|---|---|---|---|---|
| | Cleaning with Solvent | Cleaning with Water | Drying | Inital Contact Angle [*] | Contact. Angle after Surface Treatment [*] | Capillary Force [MM/m$^3$] <Calculated Value> | Removability of Protective Film (Contact Angle [*]) | Surface Smoothness (Ra [mm]) |
| Example 77 | Performed | Performed | Performed | <10 | 70 | 0.2 | A (<10) | A (<0.5) |
| Example 78 | Performed | Performed | Performed | <10 | 74 | 0.2 | A (<10) | A (<0.5) |
| Example 79 | Performed | Performed | Performed | <10 | 75 | 1.1 | A (<10) | A (<0.5) |
| Example 80 | Performed | Performed | Performed | <10 | 75 | 0.2 | A (<10) | A (<0.5) |
| Example 81 | Performed | Performed | Performed | <10 | 75 | 0.3 | A (<10) | A (<0.5) |
| Example 82 | Performed | Performed | Performed | <10 | 78 | 0.2 | A (<10) | A (<0.5) |
| Example 83 | Performed | Performed | Performed | <10 | 74 | 1.2 | A (<10) | A (<0.5) |
| Example 84 | Performed | Performed | Performed | <10 | 72 | 0.3 | A (<10) | A (<0.5) |
| Example 85 | Performed | Performed | Performed | <10 | 74 | 0.2 | A (<10) | A (<0.5) |
| Example 86 | Performed | Performed | Performed | <10 | 72 | 0.3 | A (<10) | A (<0.5) |
| Example 87 | Performed | Performed | Performed | <10 | 70 | 1.1 | A (<10) | A (<0.5) |
| Example 88 | Performed | Performed | Performed | <10 | 72 | 0.3 | A (<10) | A (<0.5) |
| Example 89 | Performed | Performed | Performed | <10 | 72 | 0.2 | A (<10) | A (<0.5) |
| Example 90 | Performed | Performed | Performed | <10 | 70 | 1.2 | A (<10) | A (<0.5) |
| Example 91 | Performed | Performed | Performed | <10 | 70 | 0.3 | A (<10) | A (<0.5) |

Example 78

The procedure of Example 60 was repeated with the exception that ethyldimethylchlorosilane [$C_2H_5Si(CH_3)_2Cl$] was used as the silicon compound (B) in the liquid chemical for forming a protective film to initiate a reaction as represented by the following equation thereby obtaining a liquid chemical for forming a protective film, the liquid chemical containing ethyldimethylisopropoxysilane as the silicon compound (A). Results of the evaluation are as shown in Table 4. The contact angle obtained after the surface treatment was 74° and therefore a water-repellency-imparting effect was exhibited. Additionally, the capillary force obtained in the case where water was retained was so small as to be 0.9 MN/m². Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

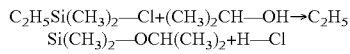

$C_2H_5Si(CH_3)_2\text{—}Cl+(CH_3)_2CH\text{—}OH \rightarrow C_2H_5Si(CH_3)_2\text{—}OCH(CH_3)_2+H\text{—}Cl$

Examples 79 and 80

Upon modifying the conditions employed in Example 78 (i.e., the alcohol, the concentration of the alcohol, the organic solvent and the like), a surface treatment was conducted on wafers, followed by evaluation of these. Results are shown in Table 4.

Example 81

The procedure of Example 60 was repeated with the exception that propyldimethylchlorosilane [$C_3H_7Si(CH_3)_2Cl$] was used as the silicon compound (B) in the liquid chemical for forming a protective film to initiate a reaction as represented by the following equation thereby obtaining a liquid chemical for forming a protective film, the liquid chemical containing propyldimethylisopropoxysilane as the silicon compound (A). Results of the evaluation are as shown in Table 4. The contact angle obtained after the surface treatment was 76° and therefore a water-repellency-imparting effect was exhibited. Additionally, the capillary force obtained in the case where water was retained was so small as to be 0.8 MN/m². Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

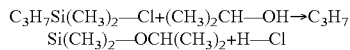

$C_3H_7Si(CH_3)_2\text{—}Cl+(CH_3)_2CH\text{—}OH \rightarrow C_3H_7Si(CH_3)_2\text{—}OCH(CH_3)_2+H\text{—}Cl$

Examples 82 and 83

Upon modifying the conditions employed in Example 81 (i.e., the alcohol, the concentration of the alcohol, the organic solvent and the like), a surface treatment was conducted on wafers, followed by evaluation of these. Results are shown in Table 4.

Example 84

The procedure of Example 60 was repeated with the exception that trifluoropropyldimethylchlorosilane [$CF_3C_2H_4Si(CH_3)_2Cl$] was used as the silicon compound (B) in the liquid chemical for forming a protective film to initiate a reaction as represented by the following equation thereby obtaining a liquid chemical for forming a protective film, the liquid chemical containing trifluoropropyldimethylisopropoxysilane as the silicon compound (A). Results of the evaluation are as shown in Table 4. The contact angle obtained after the surface treatment was 72° and therefore a water-repellency-imparting effect was exhibited. Additionally, the capillary force obtained in the case where water was retained was so small as to be 1.0 MN/m². Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

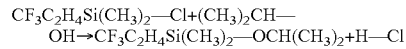

$CF_3C_2H_4Si(CH_3)_2\text{—}Cl+(CH_3)_2CH\text{—}OH \rightarrow CF_3C_2H_4Si(CH_3)_2\text{—}OCH(CH_3)_2+H\text{—}Cl$

Examples 85 and 86

Upon modifying the conditions employed in Example 84 (i.e., the alcohol, the concentration of the alcohol, the organic solvent and the like), a surface treatment was conducted on wafers, followed by evaluation of these. Results are shown in Table 4.

Example 87

The procedure of Example 60 was repeated with the exception that nonafluorohexyldimethylchlorosilane [$CF_3(CF_2)_3C_2H_4Si(CH_3)_2Cl$] was used as the silicon compound (B) in the liquid chemical for forming a protective film to initiate a reaction as represented by the following equation thereby obtaining a liquid chemical for forming a protective film, the liquid chemical containing nonafluorohexyldimethylisopropoxysilane as the silicon compound (A). Results of the evaluation are as shown in Table 4. The contact angle obtained after the surface treatment was 70° and therefore a water-repellency-imparting effect was exhibited. Additionally, the capillary force obtained in the case where water was retained was so small as to be 1.1 MN/m². Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

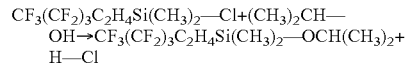

$CF_3(CF_2)_3C_2H_4Si(CH_3)_2\text{—}Cl+(CH_3)_2CH\text{—}OH \rightarrow CF_3(CF_2)_3C_2H_4Si(CH_3)_2\text{—}OCH(CH_3)_2+H\text{—}Cl$

Examples 88 and 89

Upon modifying the conditions employed in Example 87 (i.e., the alcohol, the concentration of the alcohol, the organic solvent and the like), a surface treatment was conducted on wafers, followed by evaluation of these. Results are shown in Table 4.

Example 90

The procedure of Example 88 was repeated with the exception that a silicon wafer having a smooth silicon nitride film (a silicon wafer formed having on its surface a silicon nitride layer of 0.3 μm thickness) was used. Results of the evaluation are as shown in Table 4. The contact angle obtained after the surface treatment was 70° and therefore a water-repellency-imparting effect was exhibited. Additionally, the capillary force obtained in the case where water was retained was so small as to be 1.1 MN/m². Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

Example 91

The procedure of Example 88 was repeated with the exception that a silicon wafer having no film was used. Results of the evaluation are as shown in Table 4. The contact angle obtained after the surface treatment was 70° and therefore a water-repellency-imparting effect was exhibited. Additionally, the capillary force obtained in the case where water was retained was so small as to be 1.1 MN/m². Additionally, the contact angle obtained after UV irradiation was smaller than 10°, which means that removal of the protective film was achieved. Furthermore, the Ra value of the wafer after UV irradiation was less than 0.5 nm, with which it was confirmed that the wafer was not eroded at the time of cleaning and that residues of the protective film did not remain after UV irradiation.

Comparative Example 1

The procedure of Example 1 was repeated with the exception that the liquid chemical for forming a protective film was not supplied to the silicon wafer. More specifically, in Comparative Example 1, a wafer whose surface was under a condition not provided with the water repellency was evaluated. Results of the evaluation are as shown in Table 5. The contact angle of the wafer was so small as to be 3°. Additionally, the capillary force obtained in the case where water was retained was so large as to be 3.2 MN/m².

TABLE 5

| | Liquid Chemical for forming Protective Film Starting Material | | | | | |
|---|---|---|---|---|---|---|
| | Silicon Compound (A) | Concentration of Silicon Compound (A) [mass %] | Acid | Acid Concentration [mass %] | Organic Solvent Kind | Alcohol Solvent |
| Comparative Example 1 | Not Treated | — | — | — | — | — |
| Comparative Example 2 | $(CH_3)_3Si-OCH_3$ | 3 | HCl | 0.1 | iPA/$H_2O$ | iPA |
| Comparative Example 3 | — | — | $CF_3SO_3H$ | 1 | HFE-7100 | — |
| Comparative Example 4 | $(CH_3)_3Si-OCH_3$ | 3 | — | — | HFE-7100 | — |
| Comparative Example 5 | $(CH_3)_3Si-NH-Si(CH_3)_3$ | 10 | — | — | PGMEA | — |

| | Oganic Solvent Alcohol Concentration [mass %] | Drying | Treatment after Surface Treatment with Liquid Chemical for forming Protective Film | | |
|---|---|---|---|---|---|
| | | | Cleaning with Solvent | Cleaning with Water | Drying |
| Comparative Example 1 | — | Not Perfomed | Perfomed | Perfomed | Perfomed |
| Comparative Example 2 | 94.6 | Not Perfomed | Perfomed | Perfomed | Perfomed |
| Comparative Example 3 | — | Not Perfomed | Perfomed | Perfomed | Perfomed |
| Comparative Example 4 | — | Not Perfomed | Perfomed | Perfomed | Perfomed |

TABLE 5-continued

| | | | | | |
|---|---|---|---|---|---|
| Comparative Example 5 | — | Not Perfomed | Perfomed | Perfomed | Perfomed |

| | Evaluation Results | | | | |
|---|---|---|---|---|---|
| | Initial Contact Angle [*] | Contact Angle after Surface Treatment [*] | Capillary Force [$MN/m^2$] <Calculated Value> | Removability of Protective Film (Contact Angle [*]) | Surface Smoothness (Ra [nm]) |
| Comparative Example 1 | <10 | 3 | 3.2 | — | — |
| Comparative Example 2 | <10 | 16 | 3.1 | — | — |
| Comparative Example 3 | <10 | 14 | 3.1 | — | — |
| Comparative Example 4 | <10 | 10 | 3.2 | — | — |
| Comparative Example 5 | <10 | 30 | 2.8 | — | — |

Comparative Example 2

The procedure of Example 1 was repeated with the exception that 3.0 g of trimethylmethoxysilane and 94.6 g of iPA were mixed and then 2.4 g of 1N aqueous hydrochloric acid was added thereto, followed by stirring at room temperature for about 24 hours thereby obtaining a liquid chemical for forming a protective film and that the purification (removal of water) was not performed thereafter. The water content of the thus obtained liquid chemical for forming a protective film was 21000 mass ppm. Results of the evaluation are as shown in Table 5. The contact angle obtained after the surface treatment was so small as to be 16°. Additionally, the capillary force obtained in the case where water was retained was so large as to be 3.1 $MN/m^2$.

Comparative Example 3

The procedure of Example 1 was repeated with the exception that trimethylmethoxysilane was not used at the time of preparing the liquid chemical for forming a protective film. More specifically, in the present comparative example, a liquid chemical that does not contain the silicon compound (A) was prepared. Results of the evaluation are as shown in Table 5. The contact angle obtained after the surface treatment was so small as to be 14°. Additionally, the capillary force obtained in the case where water was retained was so large as to be 3.1 $MN/m^2$.

Comparative Example 4

The procedure of Example 1 was repeated with the exception that trifluoromethanesulfonic acid was not added at the time of preparing the liquid chemical for forming a protective film. More specifically, in the present comparative example, a liquid chemical that does not contain acid was prepared. Results of the evaluation are as shown in Table 5. The contact angle obtained after the surface treatment was so small as to be 10°. Additionally, the capillary force obtained in the case where water was retained was so large as to be 3.2 $MN/m^2$.

Comparative Example 5

The procedure of Example 14 was repeated with the exception that hexamethyldisilazane [$(CH_3)_3Si—NH—Si(CH_3)_3$] was used as the silicon compound (A) in the liquid chemical for forming a protective film and the acid was not added. Results of the evaluation are as shown in Table 5. The contact angle obtained after the surface treatment was so small as to be 30°. Additionally, the capillary force obtained in the case where water was retained was so large as to be 2.8 $MN/m^2$.

Comparative Example 6

The procedure of Example 77 was repeated with the exception that hexamethyldisilazane [$(CH_3)_3Si—NH—Si(CH_3)_3$] was used as the silicon compound (D) in the liquid chemical for forming a protective film thereby obtaining the liquid chemical for forming a protective film. Results of the evaluation are as shown in Table 6. The contact angle obtained after the surface treatment was so small as to be 40°. Additionally, the capillary force obtained in the case where water was retained was so large as to be 2.5 $MN/m^2$.

| | Liquid Chemical for forming Protective Film Starting Material | | | | |
|---|---|---|---|---|---|
| | | Concentration | | Organic Solvent | |
| | Silicon Compound (D) | of Silicon Compound (D) [mass %] | Kind | Alcohol Solvent | Alcohol Concentration [mass %] |
| Comparative Example 6 | (CH₃)₃Si—NH—Si(CH₃)₃ | 10 | HFE-7100/nPA | nPA | 5 |

| | Liquid Chemical for forming Protective Film | | | Treatment after Surface Treatment with Liquid Chemical for forming Protective Film | | |
|---|---|---|---|---|---|---|
| | Silicon Compound (C) formed in Liquid Chemical | Base formed in Liquid Chemical | Drying | Cleaning with Solvent | Cleaning with Water | Drying |
| Comparative Example 6 | (CH₃)₃Si—NH—SiCH₃)₃ | NH | Not Perfomed | Perfomed | Perfomed | Perfomed |

Evaluation Results

| | Initial Contact Angle [°] | Contact Angle after Surface Treatment [°] | Capillary Force [MN/m²] <Calculated Value> | Removability of Protective Film (Contact Angle [°]) | Surface Smoothness (Ra [nm]) |
|---|---|---|---|---|---|
| Comparative Example 6 | <10 | 40 | 2.5 | — | — |

Comparative Example 7

The procedure of Example 4 was repeated with the exception that 0.5 g of water was added to 100 g of the liquid chemical for forming a protective film which liquid chemical was obtained in Example 4, so as to provide the liquid chemical with a water content of larger than 5000 mass ppm. The contact angle obtained after the surface treatment was so small as to be 14°. Additionally, the capillary force obtained in the case where water was retained was so large as to be 3.1 MN/m². This is considered to be caused by an excessively large presence of water in the liquid chemical because the action of the acid as the catalyst was weakened thereby.

EXPLANATION OF REFERENCE NUMERALS

1 Wafer
2 Finely uneven pattern on a wafer surface
3 Projected portions of the pattern
4 Recessed portions of the pattern
5 Width of the recessed portions
6 Height of the projected portions
7 Width of the projected portions
8 Liquid chemical for forming a protective film, retained in the recessed portions 4
9 Water-based cleaning liquid retained in the recessed portions 4
10 Protective film

The invention claimed is:

1. A liquid chemical for forming a water repellent protective film, the liquid chemical being able to form a water repellent protective film on a wafer that has at its surface a finely uneven pattern and contains silicon element at least at a part of the uneven pattern, the water repellent protective film being formed at least on surfaces of recessed portions of the uneven pattern at the time of cleaning the wafer, comprising:

a silicon compound (A) represented by the following general formula [1];

an acid that donates a proton to the silicon compound (A) and/or an acid that accepts electrons from the silicon compound (A); and a solvent in which the silicon compound (A) and the acid are dissolved, wherein the number of particles larger than 0.5 μm is not more than 100 per 1 mL of the liquid chemical, in a particle measurement conducted in a liquid phase of the liquid chemical by a light scattering type liquid-borne particle detector, wherein the total amount of water in the liquid chemical is no greater than 1000 mass ppm relative to the total amount of the liquid chemical

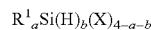

$$R^1{}_a Si(H)_b(X)_{4-a-b} \quad [1]$$

wherein $R^1$ mutually independently represents at least one group selected from monovalent organic groups having a $C_1$-$C_{18}$ hydrocarbon group and monovalent organic groups having a $C_1$-$C_8$ fluoroalkyl chain; X mutually independently represents at least one group selected from halogen groups, monovalent organic groups of which element to be bonded to a silicon element is oxygen or nitrogen, and nitrile group; "a" is an integer of from 1 to 3, "b" is an integer of from 0 to 2, and the total of "a" and "b" is not larger than 3.

2. A liquid chemical for forming a water repellent protective film, as claimed in claim 1, wherein the silicon compound (A) represented by the general formula [1] is alkoxysilane represented by the following general formula [2]

$$R^2_c Si(H)_d (OR^3)_{4-c-d} \quad [2]$$

wherein $R^2$ mutually independently represents at least one group selected from monovalent organic groups having a $C_1$-$C_{18}$ hydrocarbon group and monovalent organic groups having a $C_1$-$C_8$ fluoroalkyl chain; $R^3$ mutually independently represents at least one group selected from $C_1$-$C_{18}$ monovalent hydrocarbon groups the hydrogen elements of which may partially or entirely be replaced with a fluorine element(s) and a hydrocarbon group represented by $R^3$ may have one or more of carbonyl group, ether bond, ester bond and hydroxyl group; "c" is an integer of from 1 to 3, "d" is an integer of from 0 to 2, and the total of "c" and "d" is not larger than 3.

3. A liquid chemical for forming a water repellent protective film, as claimed in claim 2, wherein the alkoxysilane and the acid contained in the liquid chemical are obtained through a reaction between a silicon compound (B) and alcohol as shown in the formula [3]

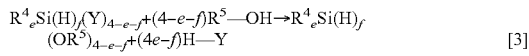

$$R^4_e Si(H)_f (Y)_{4-e-f} + (4-e-f)R^5\text{—OH} \rightarrow R^4_e Si(H)_f (OR^5)_{4-e-f} + (4e-f)H\text{—Y} \quad [3]$$

wherein $R^4_e Si(H)_f (Y)_{4-e-f}$ represents a silicon compound (B) and $R^5$—OH represents alcohol;
$R^4_e Si(H)_f (OR^5)_{4-e-f}$ represents alkoxysilane obtained by the reaction, and H—Y represents acid;
$R^4$ mutually independently represents at least one group selected from monovalent organic groups having a $C_1$-$C_{18}$ hydrocarbon group and monovalent organic groups having a $C_1$-$C_8$ fluoroalkyl chain;
$R^5$ mutually independently represents at least one group selected from $C_1$-$C_{18}$ monovalent hydrocarbon groups the hydrogen elements of which may partially or entirely be replaced with a fluorine element(s) and a hydrocarbon group represented by $R^5$ may have one or more of carbonyl group, ether bond, ester bond and hydroxyl group;
"e" is an integer of from 1 to 3, "f" is an integer of from 0 to 2, and the total of "e" and "f" is not larger than 3;
Y mutually independently represents at least one group selected from halogen groups, —OS($O_2$)—$R^6$ and —OC(O)—$R^6$; and $R^6$ is a $C_1$-$C_8$ hydrocarbon group the hydrogen elements of which may partially or entirely be replaced with a fluorine element(s).

4. A liquid chemical for forming a water repellent protective film, as claimed in claim 1, wherein the content of each of metal impurities, i.e., the content of each of Na, Mg, K, Ca, Mn, Fe and Cu is not more than 100 mass ppb relative to the total amount of the liquid chemical.

5. A process for preparing a liquid chemical for forming a water repellent protective film as claimed in claim 1, comprising the step of:
removing at least one of water content, particles and metal impurities from at least one of: the silicon compound (A) before mixing (the silicon compound (A) that serves as the starting material of the liquid chemical for forming a protective film); the acid before mixing (the acid that serves as the starting material of the liquid chemical for forming a protective film); and a mixed liquid obtained after mixing.

6. A process for preparing a liquid chemical for forming a water repellent protective film as claimed in claim 3, comprising the step of:
removing at least one of water content, particles and metal impurities from at least one of: the silicon compound (B) before mixing (the silicon compound (B) that serves as the starting material of the liquid chemical for forming a protective film); the alcohol before mixing (the alcohol that serves as the starting material of the liquid chemical for forming a protective film); and a mixed liquid obtained after mixing.

7. A process for cleaning a surface of a wafer having at its surface a finely uneven pattern, the process using a liquid chemical for forming a protective film as claimed in claim 1, comprising the step of:
removing a cleaning liquid from the surface of the wafer, followed by removing a protective film from the surface of the wafer.

8. A process for cleaning a surface of a wafer, as claimed in claim 7, wherein the step of removing the protective film from the surface of the wafer includes at least one treatment selected from irradiating the surface of the wafer with light, heating the wafer, exposing the wafer to ozone, and irradiating the surface of the wafer with plasma.

* * * * *